US012796263B2

(12) United States Patent
Yamazaki et al.

(10) Patent No.: US 12,796,263 B2

(45) Date of Patent: Nov. 10, 2026

(54) METHOD OF MANUFACTURING DISPLAY PANEL AND THE DISPLAY PANEL

(71) Applicant: SEMICONDUCTOR ENERGY LABORATORY CO., LTD., Atsugi (JP)

(72) Inventors: Shunpei Yamazaki, Tokyo (JP); Shingo Eguchi, Atsugi (JP); Kenichi Okazaki, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 377 days.

(21) Appl. No.: 18/035,606

(22) PCT Filed: Nov. 22, 2021

(86) PCT No.: PCT/IB2021/060794

§ 371 (c)(1),
(2) Date: May 5, 2023

(87) PCT Pub. No.: WO2022/123371

PCT Pub. Date: Jun. 16, 2022

(65) Prior Publication Data

US 2023/0403920 A1 Dec. 14, 2023

(30) Foreign Application Priority Data

Dec. 7, 2020 (JP) ................................ 2020-202425

(51) Int. Cl.

*H10K 59/35* (2023.01)
*G09G 3/3208* (2016.01)

(Continued)

(52) U.S. Cl.

CPC .......... *H10K 59/35* (2023.02); *G09G 3/3208* (2013.01); *H10K 59/1201* (2023.02); *H10K 71/135* (2023.02); *G09G 2300/0852* (2013.01)

(58) Field of Classification Search

CPC .. H10K 59/35; H10K 59/1201; H10K 71/135; H10K 50/11; G09G 3/3208;

(Continued)

(56) References Cited

U.S. PATENT DOCUMENTS

| | | |
|---|---|---|
| 5,953,985 A | 9/1999 | Kobayashi |
| 6,120,338 A | 9/2000 | Hirano et al. |

(Continued)

FOREIGN PATENT DOCUMENTS

| | | | |
|---|---|---|---|
| CN | 101855941 A | 10/2010 | |
| CN | 103887321 A * | 6/2014 | .......... H10K 50/125 |

(Continued)

OTHER PUBLICATIONS

International Search Report (Application No. PCT/IB2021/060794) Dated Mar. 29, 2022.

(Continued)

*Primary Examiner* — Mohammed Shamsuzzaman

(74) *Attorney, Agent, or Firm* — NIXON PEABODY LLP; Jeffrey L. Costellia

(57) ABSTRACT

A novel display panel having good functionality is provided. Provided are a display panel and a manufacturing method of the display panel, including forming an insulator including at least a first opening portion and a second opening portion over a substrate, forming a first material layer including an organic compound of a first light-emitting element in the first opening portion and a second material layer including an organic compound of a second light-emitting element in the second opening portion by a wet process, forming a first resist mask and a second resist mask respectively over the (Continued)

first material layer and the second material layer selectively, and forming a third material layer by processing the first material layer with the first resist mask, and forming a fourth material layer by processing the second material layer with the second resist mask. As the organic compounds of the light-emitting elements, a hole-transport material, a light-emitting material, and the like can be used.

15 Claims, 13 Drawing Sheets

(51) Int. Cl.
*H10K 59/12* (2023.01)
*H10K 71/13* (2023.01)

(58) Field of Classification Search
CPC ... G09G 2300/0852; G09G 2310/0262; G09G 3/3233; G09F 9/30; H05B 33/10; H05B 33/12; H05B 33/22
See application file for complete search history.

(56) References Cited

U.S. PATENT DOCUMENTS

| | | | |
|---|---|---|---|
| 6,420,834 B2 | 7/2002 | Yamazaki et al. | |
| 6,830,494 B1 | 12/2004 | Yamazaki et al. | |
| 6,843,937 B1 * | 1/2005 | Kiguchi | H10K 50/11 347/100 |
| 6,908,695 B2 | 6/2005 | Seo et al. | |
| 7,288,420 B1 | 10/2007 | Yamazaki et al. | |
| 7,547,562 B2 | 6/2009 | Ogino | |
| 7,745,991 B2 | 6/2010 | Yamazaki et al. | |
| 8,358,057 B2 | 1/2013 | Oota | |
| 8,877,532 B2 | 11/2014 | Hiroki et al. | |
| 11,710,760 B2 | 7/2023 | Kusunoki et al. | |
| 2002/0072139 A1 | 6/2002 | Kashiwabara | |
| 2005/0196893 A1 * | 9/2005 | Kim | H10K 71/18 438/82 |
| 2011/0018007 A1 | 1/2011 | Kasahara et al. | |
| 2011/0148290 A1 | 6/2011 | Oota | |
| 2012/0252149 A1 | 10/2012 | Hiroki et al. | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0135824 A1 | 4/2020 | Baek et al. | |
| 2020/0203662 A1 | 6/2020 | Mollard et al. | |

FOREIGN PATENT DOCUMENTS

| | | | | |
|---|---|---|---|---|
| EP | 2219420 A | | 8/2010 | |
| JP | 2000-036385 A | | 2/2000 | |
| JP | 2001-185354 A | | 7/2001 | |
| JP | 2003-059663 A | | 2/2003 | |
| JP | 2006085916 A | * | 3/2006 | H05B 33/10 |
| JP | 2006093685 A | * | 4/2006 | H10K 59/121 |
| JP | 2007-242272 A | | 9/2007 | |
| JP | 2008-098106 A | | 4/2008 | |
| JP | 2008-147072 A | | 6/2008 | |
| JP | 2008251270 A | * | 10/2008 | H05B 33/10 |
| JP | 2008-270782 A | | 11/2008 | |
| JP | 2009135053 A | * | 6/2009 | H10K 59/121 |
| JP | 2012-216501 A | | 11/2012 | |
| JP | 2014-120218 A | | 6/2014 | |
| JP | 2014-135251 A | | 7/2014 | |
| JP | 2014-232568 A | | 12/2014 | |
| JP | 2015-115178 A | | 6/2015 | |
| JP | 2016-197494 A | | 11/2016 | |
| JP | 2019021385 A | * | 2/2019 | H10K 59/121 |
| JP | 2019-179696 A | | 10/2019 | |
| JP | 2020-160305 A | | 10/2020 | |
| KR | 2010-0095512 A | | 8/2010 | |
| KR | 102076620 B1 | * | 2/2020 | H10K 71/60 |
| TW | 200932040 | | 7/2009 | |
| WO | WO-2009/069476 | | 6/2009 | |
| WO | WO-2022/018572 | | 1/2022 | |
| WO | WO-2022/106949 | | 5/2022 | |
| WO | WO-2022/118140 | | 6/2022 | |
| WO | WO-2022238803 A1 | * | 11/2022 | H05B 33/10 |

OTHER PUBLICATIONS

Written Opinion (Application No. PCT/IB2021/060794) Dated Mar. 29, 2022.
Zakhidov.A et al., “Orthogonal processing: A new strategy for organic electronics”, Chem. Sci. (Chemical Science), Apr. 7, 2011, vol. 2, No. 6, pp. 1178-1182.
Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.
Malinowski.P et al., “Photolithographic patterning of organic photodetectors with a non-fluorinated photoresist system”, Organic Electronics, Jul. 12, 2014, vol. 15, No. 10, pp. 2355-2359.
Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.
Papadopoulos.N et al., “AMOLED Displays with In-Pixel Photodetector”, Liquid Crystals and Display Technology, Jul. 9, 2020, pp. 1-19.
Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.
Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.
Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.
Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.
Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.
Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

* cited by examiner

METHOD OF MANUFACTURING DISPLAY PANEL AND THE DISPLAY PANEL

TECHNICAL FIELD

One embodiment of the present invention relates to a manufacturing method of a display panel and the display panel.

Note that one embodiment of the present invention is not limited to the above technical field. The technical field of one embodiment of the invention disclosed in this specification relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

One of the manufacturing methods of a display panel including an organic EL is a method in which a light-emitting layer is formed without using a fine metal mask. In an example of such a method, a light-emitting layer is deposited by a vacuum evaporation method to be a continuous film extending throughout a display region of an array substrate, and light is controlled to be emitted only to a portion of the light-emitting layer that corresponds to a specific pixel so that a luminescent organic compound is turned into a different material (see Patent Document 1).

Another example of the manufacturing method is a method in which an EL layer is formed by an inkjet process (see Patent Document 2).

REFERENCES

Patent Documents

[Patent Document 1] Japanese Published Patent Application No. 2008-270782
[Patent Document 2] Japanese Published Patent Application No. 2001-185354

SUMMARY OF THE INVENTION

Problems to be Solved by the Invention

As illustrated in FIG. 2 of Patent Document 1 given above, an organic substance layer ORG is the continuous film extending throughout the display region. In other words, the organic substance layer ORG covers a pixel electrode PE and an insulating partition layer PI. In such a structure with the organic substance layer ORG, crosstalk has been likely to occur even when the pixel electrode PE is separated between pixels PX1 to PX3. The term crosstalk refers to, for example, light emission from a non-light-emitting pixel due to the influence of an adjacent light-emitting pixel. Furthermore, in Patent Document 2 given above, the nozzle diameter of an inkjet device should fit with the size of an opening portion of a bank and therefore the nozzle diameter must be miniaturized for a high-resolution display panel.

In view of the above, to obtain a high-resolution display panel including light-emitting elements that include at least a layer including an organic compound fabricated by a wet process and can exhibit at least a first emission color and a second emission color, an object of one embodiment of the present invention is to provide a method of separating the layer including an organic compound for each light-emitting element and a structure of the light-emitting element.

In other words, an object of one embodiment of the present invention is to provide a manufacturing method of a display panel having good functionality and reduced costs. Another object is to provide a display panel having good functionality and reduced costs.

The description of these objects does not preclude the existence of other objects. Note that one embodiment of the present invention does not have to achieve all the objects. Other objects will be apparent from the description of the specification, the drawings, the claims, and the like, and other objects can be derived from the description of the specification, the drawings, the claims, and the like.

Means for Solving the Problems

In view of the above problems, one embodiment of the present invention can provide a method in which at least a layer including an organic compound included in a light-emitting element, such as a light-emitting material, a hole-transport material, an electron-transport material, or the like is fabricated by a wet process and the layer including an organic compound formed in an unnecessary region is removed by a processing step using a resist mask or the like and a structure of the light-emitting element. The manufacturing method and structure of a display panel one embodiment of the present invention are preferred in that crosstalk hardly occurs.

Such a structure enables division of the layer including an organic compound included in the light-emitting element, such as a light-emitting material, a hole-transport material, an electron-transport material, or the like in an unnecessary region, so that the layer can be prevented from extending throughout the display region. Thus, the manufacturing method of a display panel and the structure of one embodiment of the present invention are preferred in that good functionality and reduced costs can be achieved.

Specifically, one embodiment of the present invention is a manufacturing method of a display panel, including: forming an insulator including at least a first opening portion and a second opening portion over a substrate; forming a first material layer including an organic compound of a first light-emitting element in the first opening portion and a second material layer including an organic compound of a second light-emitting element in the second opening portion by a wet process; forming a first resist mask and a second resist mask respectively over the first material layer and the second material layer selectively; and forming a third material layer by processing the first material layer with the first resist mask, and forming a fourth material layer by processing the second material layer with the second resist mask.

Another embodiment of the present invention is a manufacturing method of a display panel, including: forming an insulator including at least a first opening portion and a second opening portion over a substrate; forming a first material layer including a hole-transport material of a first light-emitting element and a second light-emitting element in the first opening portion and the second opening portion by a wet process; forming a first resist mask and a second resist mask over the first material layer selectively; and forming a hole-transport region of the first light-emitting element by processing the first material layer with the first resist mask, and forming a hole-transport region of the second light-emitting element by processing the first material layer with the second resist mask.

Another embodiment of the present invention is a manufacturing method of a display panel, including: forming an insulator including a first opening portion and a second opening portion over a substrate; forming a first material layer including a light-emitting material of a first light-emitting element in the first opening portion and a second material layer including a light-emitting material of a second light-emitting element in the second opening portion by a wet process; forming a first resist mask and a second resist mask respectively over the first material layer and the second material layer selectively; and forming a light-emitting layer of the first light-emitting element by processing the first material layer with the first resist mask, and forming a light-emitting layer of the second light-emitting element by processing the second material layer with the second resist mask.

Another embodiment of the present invention is a manufacturing method of a display panel, including: forming an insulator including a first opening portion and a second opening portion over a substrate; forming a first material layer including a hole-transport material of a first light-emitting element and a second light-emitting element in the first opening portion and the second opening portion by a wet process; forming a second material layer including a light-emitting material of the first light-emitting element in the first opening portion and a third material layer including a light-emitting material of the second light-emitting element in the second opening portion by a wet process; forming a first resist mask and a second resist mask respectively over the second material layer and the third material layer selectively; and forming a light-emitting layer of the first light-emitting element by processing the second material layer with the first resist mask, and a light-emitting layer of the second light-emitting element by processing the third material layer with the second resist mask.

Another embodiment of the present invention is a manufacturing method of a display panel, including: forming an insulator including a first opening portion and a second opening portion over a substrate; forming a first material layer including a hole-transport material of a first light-emitting element and a second light-emitting element in the first opening portion and the second opening portion by a wet process; forming a second material layer including a light-emitting material of the first light-emitting element in the first opening portion and a third material layer including a light-emitting material of the second light-emitting element in the second opening portion by a wet process; forming a first resist mask and a second resist mask respectively over the second material layer and the third material layer selectively; forming a light-emitting layer of the first light-emitting element by processing the second material layer with the first resist mask, and a light-emitting layer of the second light-emitting element by processing the third material layer with the second resist mask; and forming a conductive layer throughout the first opening portion and the second opening portion.

In one embodiment of the present invention, an inkjet method is preferably used as the wet process.

Another embodiment of the present invention is a manufacturing method of a display panel, including: forming a first material layer including an organic compound of a first light-emitting element by a wet process over a substrate; forming a first resist mask over the first material layer selectively; forming a second material layer by processing the first material layer with the first resist mask; forming a third material layer including an organic compound of a second light-emitting element over the substrate and the first resist mask; forming a second resist mask over the third material layer selectively; and forming a fourth material layer by processing the third material layer with the second resist mask.

Another embodiment of the present invention is a manufacturing method of a display panel, including: forming a first material layer including a light-emitting material of a first light-emitting element by a wet process over a substrate; forming a first resist mask over the first material layer selectively; forming a light-emitting layer of the first light-emitting element by processing the first material layer with the first resist mask; forming a second material layer including a light-emitting material of a second light-emitting element over the substrate and the first resist mask; forming a second resist mask over the second material layer selectively; and forming a light-emitting layer of the second light-emitting element by processing the second material layer with the second resist mask.

Another embodiment of the present invention is a manufacturing method of a display panel, including: forming a first material layer including a hole-transport material of a first light-emitting element and a second light-emitting element by a wet process over a substrate; forming a second material layer including a light-emitting material of the first light-emitting element by a wet process over the first material layer; forming a first resist mask over the second material layer selectively; forming a light-emitting layer of the first light-emitting element by processing the second material layer with the first resist mask; forming a third material layer including a light-emitting material of the second light-emitting element over the substrate and the first resist mask; forming a second resist mask over the third material layer selectively; forming a light-emitting layer of the second light-emitting element by processing the third material layer with the second resist mask; and forming a conductive layer over the light-emitting layer of the first light-emitting element and the light-emitting layer of the second light-emitting element.

In one embodiment of the present invention, a spin coating method is preferably used as the wet process.

In one embodiment of the present invention, a mask layer is preferably formed under the first resist mask and the second resist mask.

Another embodiment of the present invention is a display panel including an insulator over a substrate. The insulator includes a first opening portion and a second opening portion in a top view. A first material layer including an organic compound of a first light-emitting element is located in the first opening portion and the first material layer does not include a region overlapping with an upper surface of the insulator. A second material layer including an organic compound of a second light-emitting element is located in the second opening portion and the second material layer does not include a region overlapping with the upper surface of the insulator. Another embodiment of the present invention is a display panel including an insulator over a substrate. The insulator includes a first opening portion and a second opening portion in a top view. A first material layer including a hole-transport material of a first light-emitting element is located in the first opening portion and the first material layer does not include a region overlapping with an upper surface of the insulator. A second material layer including a hole-transport material of a second light-emitting element is located in the second opening portion and the second material layer does not include a region overlapping with an upper surface of the insulator.

Another embodiment of the present invention is a display panel including an insulator over a substrate. The insulator includes a first opening portion and a second opening portion in a top view. A first material layer including a light-emitting material of a first light-emitting element is located in the first opening portion and the first material layer does not include a region overlapping with an upper surface of the insulator. A second material layer including a light-emitting material of a second light-emitting element is located in the second opening portion and the second material layer does not include a region overlapping with an upper surface of the insulator.

In one embodiment of the present invention, at least the first light-emitting element preferably includes stacked light-emitting units.

In one embodiment of the present invention, the stacked light-emitting units preferably include a phosphorescent light-emitting material.

In one embodiment of the present invention, the stacked light-emitting units preferably include a fluorescent light-emitting material.

The display panel of one embodiment of the present invention preferably includes a top-emission structure in which light is extracted through a side opposite to the substrate.

The display panel of one embodiment of the present invention preferably includes a bottom-emission structure in which light is extracted through a substrate side.

Effect of the Invention

One embodiment of the present invention can provide a high-resolution display panel with a plurality of light-emitting elements without using a metal mask, and the display panel has the effect of making crosstalk hardly occur. Thus, one embodiment of the present invention can provide a manufacturing method of a display panel having good functionality and reduced costs and the display panel.

The description of these effects does not preclude the existence of other effects. Note that one embodiment of the present invention does not need to have all the effects. Other effects will be apparent from the description of the specification, the drawings, the claims, and the like, and other effects can be derived from the description of the specification, the drawings, the claims, and the like.

MODE FOR CARRYING OUT THE INVENTION

Figure 1A:
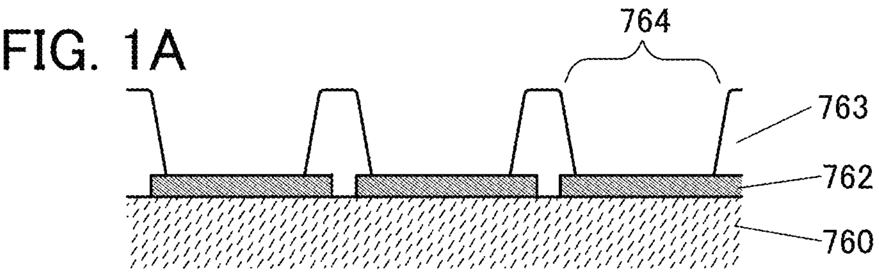
FIG. 1A to FIG. 1E are diagrams illustrating a manufacturing method of a display panel according to an embodiment.

Although the block diagram in drawings attached to this specification is used in some cases for description of components classified based on their functions in independent blocks, it is difficult to classify actual components based on their functions completely, and one component can have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the source and the drain interchange with each other according to the above relationship of the potentials.

In this specification, a "source" of a transistor means a source region that is part of a semiconductor film functioning as an active layer or means a source electrode connected to the semiconductor film. Similarly, a "drain" of a transistor means a drain region that is part of the semiconductor film or means a drain electrode connected to the semiconductor film. Moreover, a gate means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive layer has functions of a plurality of components, such as a case where part of a wiring serves as an electrode. Connection in this specification also includes such a case where one conductive film has functions of a plurality of components, in its category.

In this specification, a first electrode and a second electrode of a transistor are used for description in some cases; when one of the first electrode and the second electrode refers to a source electrode, the other thereof refers to a drain electrode.

In this specification, a light-emitting element is referred to as a light-emitting device in some cases. A light-emitting element has a structure in which a layer including an organic compound (referred to as an organic compound layer) is interposed between a pair of electrodes. One of the pair of electrodes is an anode, the other of the pair of electrodes is a cathode, and at least one organic compound layer is a light-emitting layer.

In this specification, a light-emitting device including an organic compound layer formed without using a metal mask or a fine metal mask is sometimes referred to as a light-emitting device having a metal maskless (MML) structure.

In this specification, light-emitting elements exhibiting for example, red, green, and blue are sometimes referred to as a red light-emitting element, a green light-emitting element, and a blue light-emitting element, respectively.

In this specification, a structure in which light-emitting layers of light-emitting elements are separately formed is sometimes referred to as an SBS (Side By Side) structure. For example, fabrication of a red light-emitting layer, a green light-emitting layer, and a blue light-emitting layer with an SBS structure enables a full-color display apparatus.

In this specification, a light-emitting element capable of emitting white light is referred to as a white-light-emitting element in some cases. Note that a combination of such a white-light-emitting element with coloring layers (e.g., color filters or color conversion layers) enables providing a full-color display apparatus.

The light-emitting elements can be roughly classified into a single structure and a tandem structure. In the single structure, one light-emitting unit is provided between a pair of electrodes. The light-emitting unit refers to a stack including one or more light-emitting layers.

A white light-emitting element with a single structure can be obtained when two or more light-emitting layers are included in a light-emitting unit, and the emission colors of the two or more light-emitting layers are complementary colors. The two or more light-emitting layers may be in contact with each other in the light-emitting element. A white light-emitting element can also be obtained when three or more light-emitting layers are included and the emission colors are complementary colors. The three or more light-emitting layers may be in contact with each other in the light-emitting unit.

In the tandem structure, two or more light-emitting units are provided between a pair of electrodes. Each of the two or more light-emitting units refers to a stack including one or more light-emitting layers. In the tandem structure, an intermediate layer such as a charge-generation layer is suitably provided between the plurality of light-emitting units. The charge-generation layer has a function of injecting holes into one of the light-emitting units that is in contact with the charge-generation layer and injecting electrons into the other light-emitting unit, when voltage is applied between the cathode and the anode. For example, the tandem structure is preferably a structure in which a first light-emitting unit, a charge-generation layer, and a second light-emitting unit are provided between a pair of electrodes and, through the charge-generation layer, holes are injected into the first light-emitting unit and electrons are injected into the second light-emitting unit.

To obtain a white light-emitting element using the tandem structure, the structure is employed in which light from light-emitting layers of two or more light-emitting units is combined to enable white light emission. In the combination of light-emitting layers capable of white light emission, light of complementary colors is emitted as in the single structure.

When the above white light-emitting elements (having a single structure and a tandem structure) and a light-emitting element having an SBS structure are compared to each other, the light-emitting element having an SBS structure can have lower power consumption than the white light-emitting elements (having a single structure and a tandem structure). In the case of the electronic device in which power consumption is required to be low, the light-emitting element having an SBS structure is suitably used. Meanwhile, the white light-emitting elements (having a single structure and a tandem structure) are suitable in terms of lower manufacturing cost or higher manufacturing yield because the manufacturing process of the white light-emitting elements is simpler than that of the light-emitting element having an SBS structure.

In this specification, a structure in which a connector such as an FPC (Flexible Printed Circuit) or a TCP (Tape Carrier Package) is attached to a substrate of a display panel, or a structure in which an IC is mounted on a substrate by a COG (Chip On Glass) method or the like is referred to as a display module in some cases. Thus, the display panel is one embodiment of a display apparatus.

Next, embodiments are described in detail with reference to the drawings. The present invention is not limited to the following description of the embodiments, and it will be readily appreciated by those skilled in the art that modes and details of the present invention can be modified in various ways without departing from the spirit and scope of the present invention. Note that in structures of the invention described in the embodiments and the like, the same portions or portions having similar functions are denoted by the same reference numerals in different drawings, and the description thereof is not repeated in some cases.

Embodiment 1

In this embodiment, a first manufacturing method of a display panel of one embodiment of the present invention is described. In a manufacturing method of a display panel of one embodiment of the present invention, an organic compound layer included in a light-emitting element is formed by a wet process. A wet process is the method in which a liquid composition is obtained by a process of dissolution or dispersion of a material having a predetermined function into a solvent for liquefaction and the liquid composition is applied. A liquid composition is referred to as a droplet in some cases. After applied, the liquid composition becomes a solid or a thin film by undergoing a drying or curing step. A wet process generates fewer waste materials and enables the formation of the light-emitting element and a display panel at lower cost than an evaporation method. As wet processes, an inkjet method, a spin coating method, and the like are given and described in detail later. The first manufacturing method is described with an inkjet method as an example of a wet process. It is needless to say that the organic compound layer included in the light-emitting element may be formed by a wet process other than an inkjet method.

FIG. 1A illustrates a first substrate 760 included in a display panel, a first electrode 762 provided over the first substrate 760, and an insulator 763 which covers at least an end portion of the first electrode 762 and includes an opening portion 764. The opening portion 764 can be seen also in a top view of the insulator 763. As the first substrate 760, a substrate provided with a semiconductor element can be used. A transistor is often used as the semiconductor element, and the first substrate 760 may be referred to as a transistor substrate. The semiconductor element such as a transistor is used as a switching element, for example, which can change whether the state of the light-emitting element is light emission or non-light emission. A display panel in which the semiconductor element is provided for each light-emitting element is referred to as an active matrix display panel in some cases. A display panel in which the semiconductor element is provided for a group of light-emitting elements is referred to as a passive matrix display panel in some cases. The present invention can be applied to both an active matrix display panel and a passive matrix display panel. Note that a material and the like used for the first substrate 760 are described later.

The first electrode 762 corresponds to one of a pair of electrodes included in the light-emitting element. The first electrode 762 has a function of a cathode or an anode. The first electrode 762 includes a conductive material selected in consideration of a work function appropriate for a cathode or an anode. When the first electrode 762 includes a light-transmitting conductive material, a display panel with a so-called bottom-emission structure in which light of the light-emitting element is emitted to the first substrate 760 side can be provided. When the first electrode 762 includes a reflective conductive material, a display panel with a so-called top-emission structure in which light of the light-emitting element is emitted upward over the first electrode 762 can be provided. The present invention can be applied to both a display panel with a bottom-emission structure and a display panel with a top-emission structure. Note that a material and the like used for the first electrode 762 are described later.

The insulator 763 is located at the interface between adjacent light-emitting elements and referred to as a partition, a bank, or an embankment in some cases. That is, the adjacent light-emitting elements are divided by the insulator 763. Although the insulator 763 looks divided in FIG. 1A which is a cross-sectional view, the insulator 763 has a continuous structure when seen in a top view and includes the opening portion 764 exposing the first electrode 762. The opening portion 764 can be formed by a photolithography method. Note that a material and the like used for the insulator 763 are described later.

Figure 1B:
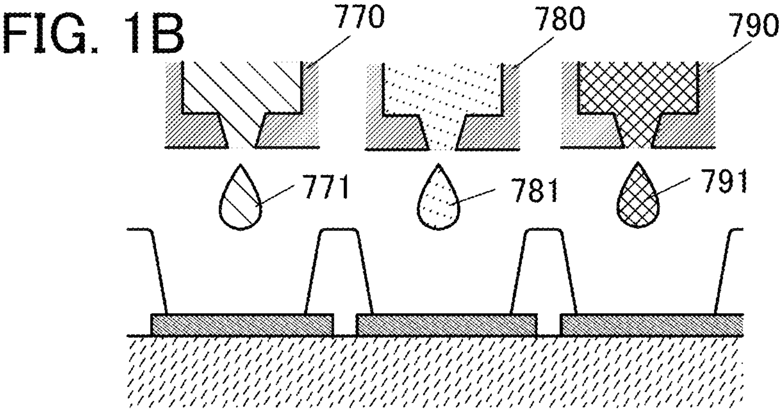

FIG. 1B illustrates the state in which a droplet including one organic compound included in the light-emitting element is applied by an inkjet method. Specifically, nozzles (a nozzle 770, a nozzle 780, and a nozzle 790) of an inkjet device are placed to face the first substrate 760, and the nozzle 770, the nozzle 780, and the nozzle 790 apply the respective droplets (a droplet 771, a droplet 781, and a droplet 791) toward the opening portions 764 of the insulator 763. Although two or more of droplets selected from the droplet 771, the droplet 781, and the droplet 791 are preferably applied at the same time for high productivity, the droplets may be applied in order. For example, the droplet 781 can be applied after the droplet 771 is applied. In the case where the droplets are applied in order, a curing step may be provided between the application steps. The curing step can prevent mixing of the droplet applied earlier with the droplet applied later. For the application, each droplet may be dripped as a drop. The application of each droplet includes the case where a liquid discharged from the nozzle is continuously dripped into the plurality of opening portions 764 without pauses.

The droplets each include any one of the organic compounds included in the light-emitting element. As the organic compound included in the light-emitting element, the one related to any of a hole-injection material, a hole-transport material, a light-emitting material, an electron-transport material, and an electron-injection material is given. In other words, the droplets can each include any one of a hole-injection material, a hole-transport material, a light-emitting material, an electron-transport material, and an electron-injection material. For the formation with the light-emitting material by an inkjet method, for example, the droplet 771, the droplet 781, and the droplet 791 preferably include an organic compound, a solvent, and the like related to a red light-emitting material, an organic compound, a solvent, and the like related to a green light-emitting material, and an organic compound, a solvent, and the like related to a blue light-emitting material, respectively. When the droplet 771, the droplet 781, and the droplet 791 are applied at the same time, the organic compounds included in the light-emitting elements are preferably the materials that have the same function selected from the hole-injection material, a hole-transport material, the light-emitting material, the electron-transport material, and the electron-injection material.

The hole-injection material and the hole-transport material can be shared between the light-emitting elements and such a layer is referred to as a common layer. The electron-injection material and the electron-transport material can also be formed into common layers. In the application for a common layer, a plurality of nozzles are not necessarily required and one nozzle may be employed. The application with one nozzle preferably employs a nozzle with a large diameter for high productivity. In the application for a common layer, a spin coating method can be used.

Although FIG. 1B illustrates the state in which the organic compounds included in the light-emitting elements are applied to the first substrate 760 by an inkjet method, a spin coating method or the like can be employed instead of an inkjet method. In other words, according to the present invention, at least one of the organic compounds included in the light-emitting elements can be formed over the first substrate 760 by a wet process such as an inkjet method or a spin coating method.

Figure 1C:
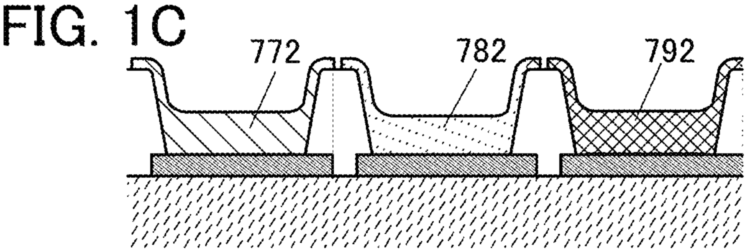

The nozzle 780 and the first substrate 760 are relatively shifted, and layers including the organic compounds (material layers) included in the light-emitting elements are formed as illustrated in FIG. 1C. The material layers (a material layer 772, a material layer 782, and a material layer 792) are formed in at least the opening portions 764. The material layer 772, the material layer 782, and the material layer 792 are sometimes formed on an upper surface of the insulator 763. A portion of the material layer located in the opening portion 764 is often thicker than a portion of the material layer located on the upper surface of the insulator 763. A side surface of the insulator 763 is sloping in the opening portion 764 in some cases; the portion of the material layer located on the upper surface of the insulator 763 is sometimes thinner than a portion of the material layer located on the sloping region. The material layer can be actively placed in the opening portion 764 when surface treatment is performed on the insulator 763. An example of the surface treatment is treatment making the insulator 763 water-repellent.

The material layer 772, the material layer 782, and the material layer 792 are each preferably subjected to a drying step or the like so that the solvent included in the droplet is volatilized or vaporized. The drying step may be natural drying or heating.

Preferably, a surface of each of the material layer 772, the material layer 782, and the material layer 792 is cured in addition to the drying step or the like. For example, at least the surface can be cured through a light irradiation step or the like. As the light, ultraviolet light or infrared light can be used. The light irradiation step can also planar the surfaces of the material layer 772, the material layer 782, and the material layer 792.

Figure 1D:
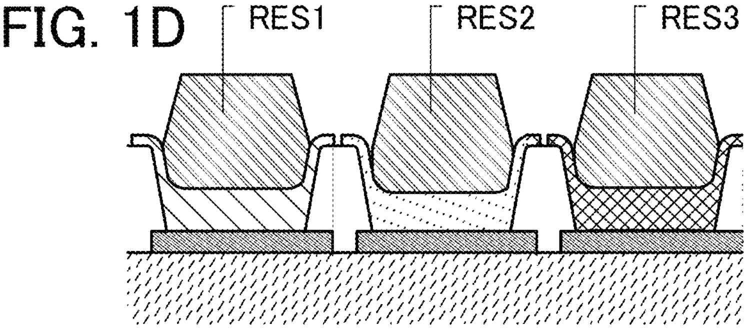

As illustrated in FIG. 1D, a first resist mask RES1, a second resist mask RES2, and a third resist mask RES3 are selectively formed over the material layer 772, the material layer 782, and the material layer 792, respectively. The first resist mask RES1, the second resist mask RES2, and the third resist mask RES3 are each preferably formed to overlap with the first electrode 762. The first resist mask RES1, the second resist mask RES2, and the third resist mask RES3 each preferably have a size fitting inside the opening portion 764. According to the cross-sectional view in FIG. 1D, the width of the first resist mask RES1 is less than or equal to the width of the opening portion 764. The width of the second resist mask RES2 and the width of the third resist mask RES3 are similar to the width of the first resist mask RES1. As each of the first resist mask RES1, the second resist mask RES2, and the third resist mask RES3, a negative-type resist or a positive-type resist can be used.

Figure 1E:
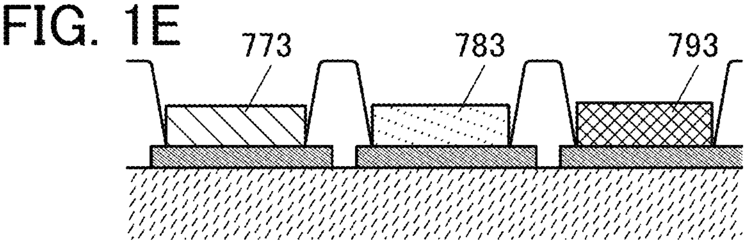

With the use of the first resist mask RES1, the material layer 772 is processed, or more specifically is partly removed, thereby forming a processed material layer 773 as illustrated in FIG. 1E. With the use of the second resist mask RES2, the material layer 782 is processed, or more specifically is partly removed, thereby forming a processed material layer 783. With the use of the third resist mask RES3, the material layer 792 is processed, or more specifically is partly removed, thereby forming a processed material layer 793. The first resist mask RES1 to the third resist mask RES3 are removed after the material layers are processed.

In the processing step, an etching method, a laser ablation method, or the like can be used. Dry etching or wet etching can be used as the etching In a laser ablation method, a resist mask may be used as a light-absorbing layer or a light-reflecting layer for laser irradiation.

When the material layer 772 is processed while the first resist mask RES1 is placed, a miniaturized light-emitting element can be provided regardless of the nozzle diameter of the nozzle 770, and a high-resolution display panel can be provided. Since the material layers are divided between the adjacent light-emitting elements by the removal of a region that is part of the material layer 772, a display panel with less crosstalk can be provided.

In the display panel of this embodiment, although the emission colors of adjacent light-emitting elements in the cross-sectional view in FIG. 1E are preferably different from one another, the light-emitting elements that exhibit the same emission color may be used. For example, the light-emitting layers can be separately formed as the material layer 773 for a red light-emitting element, the material layer 783 for a green light-emitting element, and the material layer 793 for a blue light-emitting element. Such a structure is referred to as an SBS structure. This embodiment is not limited to the structure with three colors. For example, a structure with four or more colors to which a white light-emitting element is added may be employed in this embodiment.

Next, materials and the like that can be used for the components are described.

<Material of First Substrate>

For the first substrate 760, a material such as glass, quartz, ceramic, sapphire, or an organic resin can be used. Since the above material has a light-transmitting property, light from the light-emitting element can be extracted through the first substrate 760. Despite the name, "substrate" can have flexibility with the use of an organic resin given as the above material. Furthermore, the thickness can be smaller than that of the image of "substrate," and a film form can be obtained. Thus, the display panel of this embodiment can have flexibility and a film form depending on the material used for the first substrate 760. Other than the above materials, a metal substrate or the like using a metal material or an alloy material can be used as the first substrate 760. Such a material has no light-transmitting property and therefore can be used when light of the light-emitting element is not extracted through the first substrate 760.

<Material of First Electrode>

When the first electrode 762 is used as the cathode, a metal, an alloy, an electrically conductive compound, or a mixture thereof having a low work function (specifically, 3.8 eV or less) or the like can be used. Specific examples include elements belonging to Groups 1 and 2 of the periodic table, such as alkali metals (e.g., lithium (Li) and cesium (Cs)), alkaline earth metals such as magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when an electron-injection layer is provided between the cathode and the electron-transport layer, any of a variety of conductive materials such as Al, Ag, ITO, or indium oxide-tin oxide containing silicon or silicon oxide can be used for the cathode regardless of the work function. Films including these conductive materials can be formed by a sputtering method, an inkjet method, a spin coating method, or the like.

When the first electrode 762 is used as the anode, a metal, an alloy, or a conductive compound having a high work function (specifically, 4.0 eV or more), a mixture thereof, or the like is preferably used. Specifically, for example, conductive metal oxide films of indium oxide-tin oxide (ITO: Indium Tin Oxide), indium oxide-tin oxide containing silicon or silicon oxide, indium oxide-zinc oxide (also referred to as IZO as an abbreviation of Indium Zinc Oxide), indium oxide containing tungsten oxide and zinc oxide (IWZO), and the like can be given. These conductive metal oxide films are usually formed by a sputtering method but may also be formed by application of a sol-gel method or the like. For example, indium oxide-zinc oxide can be formed by a sputtering method using a target in which 1 to 20 wt % zinc oxide is added to indium oxide. Furthermore, indium oxide containing tungsten oxide and zinc oxide (IWZO) can be deposited by a sputtering method using a target in which, to indium oxide, tungsten oxide is added at greater than or equal to 0.5 wt % and less than or equal to 5 wt % and zinc oxide is added at greater than or equal to 0.1 wt % and less than or equal to 1 wt %. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), and the like can be given.

<Material of Insulator>

An organic material or an inorganic material can be used for the insulator 763. For example, the insulator 763 preferably includes an organic resin such as a polyimide resin, a polyamide resin, an acrylic resin, a siloxane resin, a silicone resin, an epoxy resin, or a phenol resin. The insulator 763 preferably includes one or more selected from aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide as the other examples. A stacked-layer structure including the above materials may be used for the insulator 763. Note that a material in which an impurity element such as lanthanum (La), nitrogen, zirconium (Zr), or the like is added to the above material may be used.

An upper end portion and a lower end portion of the insulator 763 preferably have curvature. The insulator 763 can have the above curvature by using a positive-type photosensitive acrylic resin. The insulator 763 can have the above curvature by using a negative-type photosensitive resin or a positive-type photosensitive resin.

<Wet Process>

A wet process includes an inkjet method, a spin coating method, a coating method, a nozzle printing method, gravure printing, or the like. Examples of the solvent that can be used in the wet process include chlorine-based solvents such as dichloroethane, trichloroethane, chlorobenzene, and dichlorobenzene. Other examples of the above solvent include ether-based solvents such as tetrahydrofuran, dioxane, anisole, and methylanisole. Other examples of the above solvent include aromatic hydrocarbon-based solvents such as toluene, xylene, mesitylene, ethylbenzene, hexylbenzene, and cyclohexylbenzene. Other examples of the above solvent include aliphatic hydrocarbon-based solvents such as cyclohexane, methylcyclohexane, pentane, hexane, heptane, octane, nonane, decane, dodecane, and bicyclohexyl. Other examples of the above solvent include ketone-based solvents such as acetone, methyl ethyl ketone, benzophenone, and acetophenone. Other examples of the above solvent include ester-based solvents such as ethyl acetate, butyl acetate, ethyl cellosolve acetate, methyl benzoate, and phenyl acetate. Other examples of the above solvent include polyalcohol-based solvents such as ethylene glycol, glycerin, and hexanediol. Other examples of the above solvent include alcohol-based solvents such as isopropyl alcohol and cyclohexanol. Another example of the above solvent is a sulfoxide-based solvent such as dimethylsulfoxide. Other examples of the above solvent include amide-based solvents such as methylpyrrolidone and dimethylformamide. As the above solvent, two or more selected from the above materials can be mixed and used.

<Inkjet Device>

The inkjet device includes a nozzle. A droplet is applied from an opening provided on the nozzle. The diameter of the opening (also referred to as a nozzle diameter) is several micrometers to several tens of micrometers. A portion with the nozzle is sometimes referred to as a head of the inkjet device. To apply a droplet, the inkjet device is provided with a control portion for droplet injection. The control portion includes a piezoelectric element or the like, and the capacity of an ink tank connected to the nozzle through the piezoelectric element can be varied so that a droplet can be applied. The volume of droplets can be determined according to the nozzle diameter and, for example, can be several picoliters to several tens of picoliters per droplet. Although depending on the material included in the droplet, approximately one picoliter droplets can be considered to form an approximately 10 μm cube.

As the resolution of a display panel is increased, miniaturization of the opening portion 764 is required. On the other hand, the nozzle diameter of the inkjet device has a limitation in miniaturization because of mechanical processing. Therefore, the opening portion 764 is more miniaturized than the nozzle diameter. As a result, a droplet is applied while overflowing the opening portion in some cases (see FIG. 1C and the like). In such a case, processing using resist masks (see FIG. 1D, FIG. 1E, and the like) enables a high-resolution display panel to be provided.

<Resist Mask RES>

As a material of the resist mask, a negative type or a positive type can be used. The resist mask is formed in such a manner that a resist material is formed and exposed to specific light. In the case of the negative type, the solubility of a portion exposed to light in a developer is decreased and accordingly the portion exposed to light remains after development. Thus, the portion exposed to light is used as the resist mask. In the case of the positive type, the solubility of a portion exposed to light in a developer is increased and accordingly a portion that has not been exposed to light remains after development. Thus, the portion that has not been exposed to light is used as the resist mask. As a light source used for the light exposure, an excimer laser, an electron beam, an ultraviolet ray, or the like can be used. The use of the resist mask enables minute processing with several tens of nanometers to several tens of micrometers, preferably greater than or equal to 100 nm and less than or equal to 5 μm.

<Light-Emitting Element>

Figure 5A:
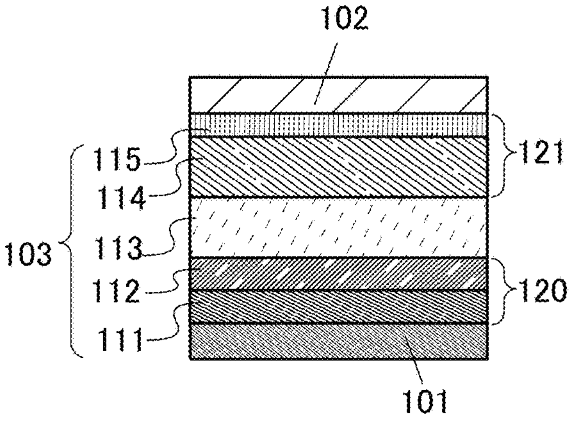
FIG. 5A to FIG. 5F are diagrams illustrating light-emitting elements according to an embodiment.
Figure 5B:
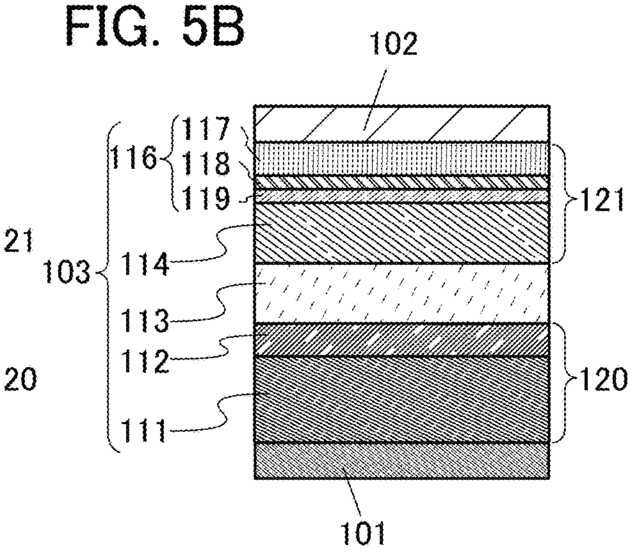
Figure 5C:
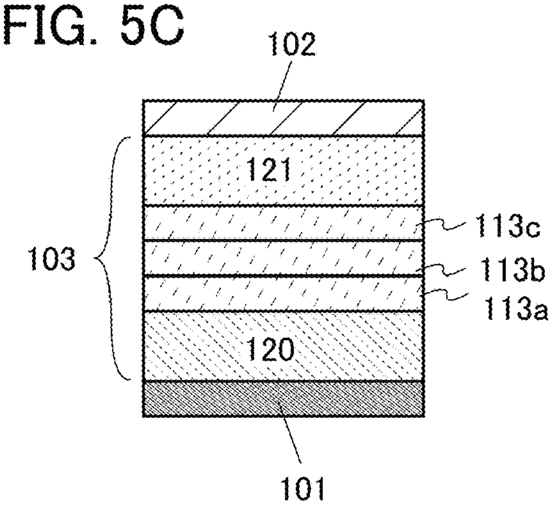

FIG. 5A to FIG. 5C schematically illustrate light-emitting elements each having a single structure. First, the light-emitting element illustrated in FIG. 5A includes an anode 101, a cathode 102, and an EL layer 103 which is an organic compound layer. The anode 101 or the cathode 102 corresponds to the first electrode 762. The EL layer 103 includes a hole-transport region 120, a light-emitting layer 113, and an electron-transport region 121.

The light-emitting layer 113 includes at least an organic compound having a light-emitting property, the hole-transport region 120 includes at least an organic compound having a hole-transport property, and the electron-transport region 121 includes at least an organic compound having an electron-transport property. In the present invention, at least any one of the organic compounds can be formed by a wet process.

The hole-transport region 120 has a function of transporting holes between the anode 101 and the light-emitting layer 113. Specifically, although the hole-transport region 120 preferably includes a hole-injection layer 111 and a hole-transport layer 112, holes can be transported even with either of the hole-injection layer 111 or the hole-transport layer 112. The hole-transport region 120 preferably includes a material having a skeleton having a relatively high hole-transport property. In other words, the hole-injection layer 111 and the hole-transport layer 112 preferably include a skeleton having a relatively high hole-transport property. Examples of the skeleton having a high hole-transport property are skeletons having n-electron rich heteroaromatic ring skeletons such as an arylamine skeleton, a pyrrole skeleton, a carbazole skeleton, and a thiophene skeleton.

Although the electron-transport region 121 preferably includes an electron-transport layer 114 and an electron-injection layer 115, electrons can be transported even with either of the electron-transport layer 114 or the electron-injection layer 115.

As the electron-injection layer 115, a layer containing an alkali metal, an alkaline earth metal, or a compound or a complex thereof is preferably provided. Specifically, sodium fluoride (NaF), lithium fluoride (LiF), cesium fluoride (CsF), calcium fluoride ($CaF_2$), 8-hydroxyquinolinato-lithium (abbreviation: Liq), and the like can be given. For example, an electride or a layer that is formed using a substance having an electron-transport property and that contains an alkali metal, an alkaline earth metal, or a compound thereof can be used for the electron-injection layer 115. Examples of the electride include a substance in which electrons are added at high concentration to calcium oxide-aluminum oxide.

The use of sodium fluoride for the electron-injection layer 115 is preferred because the electron-transport property and the water resistance of the light-emitting element can be improved. When the electron-injection layer 115 including sodium fluoride is subjected to ToF-SIMS analysis, signals are observed which are attributed to anions or cations such as $Na_2F^+$, $NaF_2^-$, and $Na_2F_3^-$ being different in the number of bonds between sodium and fluorine.

As the electron-injection layer 115, a layer containing an alkaline earth metal may be provided in contact with the cathode 102. A layer containing barium can be used as the layer containing an alkaline earth metal. This structure is preferably employed to make the property of electron injection from the cathode 102 favorable.

The above layer containing barium may also include a heteroaromatic compound. As the heteroaromatic compound, an organic compound having a phenanthroline skeleton is preferably used.

In the hole-transport region 120 and the electron-transport region 121, other functional layers may be provided. Examples of the other functional layers include a carrier-blocking layer, an exciton-blocking layer, and a charge-generation layer.

In the light-emitting element illustrated in FIG. 5B, a charge-generation layer 116 is provided instead of the electron-injection layer 115 of FIG. 5A. The charge-generation layer 116 refers to a layer capable of injecting holes into a layer in contact with the charge-generation layer on the cathode side and injecting electrons into a layer in contact with the charge-generation layer on the anode side when a potential is applied. The charge-generation layer 116 includes at least a p-type layer 117. The p-type layer 117 is preferably formed using the hole-transport material that can be used for the hole-injection layer 111. The p-type layer 117 may be formed by stacking a layer containing an acceptor material and a layer containing a hole-transport material. When a potential is applied to the p-type layer 117 illustrated in FIG. 5B, electrons are injected into at least the electron-transport layer 114 and holes are injected into the cathode 102, whereby the light-emitting element is operated.

Note that the charge-generation layer 116 preferably includes one or both of an electron-relay layer 118 and an electron-injection buffer layer 119 in addition to the p-type layer 117. The electron-relay layer 118 is preferably located between the p-type layer 117 and the electron-transport layer 114. The electron-injection buffer layer 119 is preferably located between the p-type layer 117 and the electron-transport layer 114; when the electron-relay layer 118 is included, the electron-injection buffer layer 119 is preferably located between the electron-relay layer 118 and the electron-transport layer 114.

In the light-emitting element illustrated in FIG. 5C, a plurality of light-emitting layers are stacked. Specifically, a light-emitting layer 113*c*, a light-emitting layer 113*b*, and a light-emitting layer 113*a* are stacked. The emission colors of the light-emitting layer 113*c*, the light-emitting layer 113*b*, and the light-emitting layer 113*a* are preferably different from one another. The hole-transport region 120 preferably includes two layers, the hole-injection layer 111 and the hole-transport layer 112. The electron-transport region 121 preferably includes two layers, the electron-injection layer 115 and the electron-transport layer 114.

<Tandem Structure>

Figure 5D:
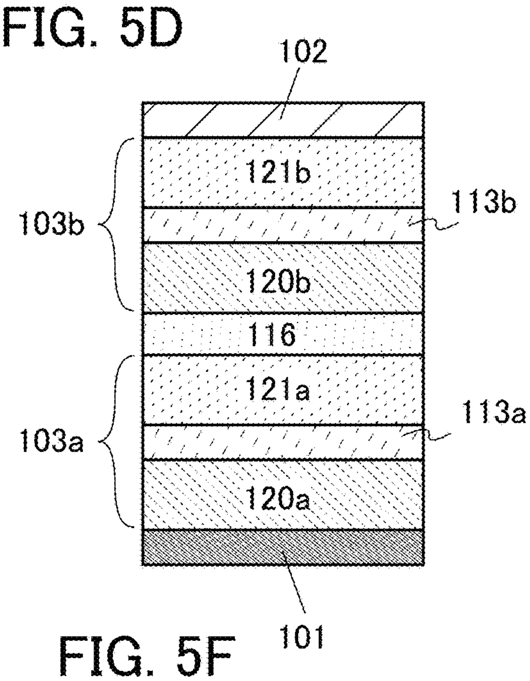

FIG. 5D schematically illustrates a light-emitting element having a tandem structure. In a tandem structure, the light-emitting layer 113 has a structure in which a plurality of light-emitting units are stacked. Specifically, at least a first light-emitting unit 103*a* and a second light-emitting unit 103*b* are included between the anode and the cathode. The first light-emitting unit 103*a* and the second light-emitting unit 103*b* can each have a structure similar to that of the EL layer 103 illustrated in FIG. 5A or the like. The first light-emitting unit 103*a* includes at least a hole-transport region 120*a*, a light-emitting layer 113*a*, and an electron-transport region 121*a*, and the second light-emitting unit 103*b* includes at least a hole-transport region 120*b*, a light-emitting layer 113*b*, and an electron-transport region 121*b*.

In the tandem structure, the charge-generation layer 116 is provided between the first light-emitting unit 103*a* and the second light-emitting unit 103*b*. The first light-emitting unit 103*a* and the second light-emitting unit 103*b* may have the same structure or different structures. In the case where the first light-emitting unit 103*a* and the second light-emitting unit 103*b* have different structures, they preferably exhibit white light emission when combined. In the case where the combination exhibits white light emission, using color filters enables full-color display.

The charge-generation layer 116 in the tandem structure has a function of injecting electrons into one of the light-emitting units and injecting holes into the other of the light-emitting units when voltage is applied between the anode and the cathode. That is, the charge-generation layer injects electrons into the first light-emitting unit 103*a* and holes into the second light-emitting unit 103*b* when voltage is applied such that the potential of the anode becomes higher than the potential of the cathode.

The charge-generation layer 116 can have a structure similar to that of the charge-generation layer 116 described with reference to FIG. 5B. As a material used for the charge-generation layer 116, a composite material of an organic compound and a metal oxide has an excellent carrier-injection property and an excellent carrier-transport property; thus, such a material is preferred because low-voltage driving or low-current driving can be achieved. In the case where the anode-side surface of a light-emitting unit is in contact with the charge-generation layer, the charge-generation layer can also serve as a hole-injection layer of the light-emitting unit; therefore, a hole-injection layer is not necessarily provided in the light-emitting unit.

The electron-injection buffer layer 119 illustrated in FIG. 5B may be provided as the charge-generation layer 116 having a tandem structure. Note that in the case where the plane of the light-emitting unit on the cathode side is in contact with the electron-injection buffer layer, the electron-injection buffer layer 119 serves as an electron-injection layer in the light-emitting unit; therefore, the light-emitting unit is not necessarily provided with an electron-injection layer.

In the tandem structure, the plurality of light-emitting units are placed between the pair of electrodes and the charge-generation layer is included between the plurality of light-emitting units. Such a structure enables a long-life element that can emit light while the current density is kept low. A light-emitting apparatus which can be driven at a low voltage and has low power consumption can be provided.

When emission colors of light-emitting units are made different, light emission of a desired color can be obtained from the light-emitting element as a whole. For example, in a light-emitting element having two light-emitting units, the emission colors of the first light-emitting unit may be red and green and the emission color of the second light-emitting unit may be blue, so that the light-emitting element can emit white light as the whole element.

The light-emitting materials in the stacked light-emitting units may each include a phosphorescent light-emitting material or a fluorescent light-emitting material.

Although the tandem structure having two light-emitting units is illustrated in FIG. 5D, a tandem structure in which three or more light-emitting units are stacked can be employed.

The layer on the anode 101 side or the layer in contact with the anode 101, such as the hole-injection layer 111 or the hole-transport layer 112, in the light-emitting element in any of FIG. 5A to FIG. 5D can be formed by a wet process. In that case, a material having an acceptor property is preferably used as the hole-transport material. Examples of the material having an acceptor property include a sulfonic acid compound, a fluorine compound, a trifluoroacetic acid compound, a propionic acid compound, and a metal oxide.

<Ink Material>

As a material of the droplet to be applied in a wet process (referred to as an ink material), a polymer material, a low molecular weight material, a dendrimer, or the like can be used as it is. As the ink material, a material in which a polymer material, a low molecular weight material, a dendrimer, or the like is dispersed in a solvent or a material in which a polymer material, a low molecular weight material, a dendrimer, or the like is dissolved in a solvent may be used. A polymer material may be obtained by mixing one or more of monomers. For mixing of one or more of monomers, the ink material in the mixed state may be applied and then subjected to heating, energy light irradiation, or the like to form a bond such as cross-linking, condensation, polymerization, coordination, or a salt.

Note that the above ink material may include a material having a different function, such as a surface active agent or a material for adjusting viscosity.

As an amine compound used as the ink material, any of a primary amine, a secondary amine, and a tertiary amine can be used, and in particular, a secondary amine is preferred. In the case where the ink material in which a plurality of monomers are mixed is applied and polymerization is formed after the application, a secondary amine and arylsulfonic acid are preferably used as the monomers.

The secondary amine preferably has a substituted or unsubstituted aryl group having 6 to 14 carbon atoms or a substituted or unsubstituted π-electron rich type heteroaryl group having 6 to 12 carbon atoms. Examples of the aryl group include a phenyl group, a biphenyl group, a naphthyl group, a fluorenyl group, a phenanthrenyl group, and an anthryl group. The above phenyl group is preferred because it improves solubility and reduces the raw material cost. Examples of the heteroaryl group include a carbazole skeleton, a pyrrole skeleton, a thiophene skeleton, a furan skeleton, and an imidazole skeleton.

The secondary amine preferably includes a plurality of bonds with an arylamine or a heteroaryl amine for the improvement of film quality after the application, heating, or curing. When the secondary amine includes many such bonds, an oligomer or a polymer is preferably formed.

The secondary amine may have a plurality of amine skeletons. In this case, some of the amine skeletons may be a primary amine or a tertiary amine. Note that the proportion of the secondary amine is preferably higher than the proportion of the primary amine or the tertiary amine. The number of amine skeletons is preferably less than or equal to 1000, further preferably less than or equal to 10, and the molecular weight of the secondary amine is preferably less than or equal to 100000. An amine skeleton substituted by fluorine is preferably used because it improves compatibility with a compound in which fluorine is substituted.

<General Formula>

The secondary amine is preferably an organic compound represented by General Formula (G1) below, for example.

[Chemical formula 1]

(G1)

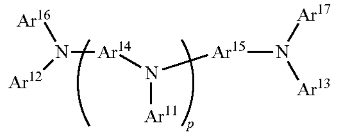

In General Formula (G1) above, one or more of $Ar^{11}$ to $Ar^{13}$ represent hydrogen, and $Ar^{14}$ to $Ar^{17}$ represent substituted or unsubstituted aromatic rings each having 6 to 14 carbon atoms. As the aromatic ring having 6 to 14 carbon atoms, a benzene ring, a bisbenzene ring, a naphthalene ring, a fluorene ring, a phenanthrene ring, or an anthracene ring can be used. Note that $Ar^{12}$ and $Ar^{16}$ may be bonded to each other to form a ring, $Ar^{14}$ and $Ar^{16}$ may be bonded to each other to form a ring, $Ar^{11}$ and $Ar^{14}$ may be bonded to each other to form a ring, $Ar^{14}$ and $Ar^{15}$ may be bonded to each other to form a ring, $Ar^{15}$ and $Ar^{17}$ may be bonded to each other to form a ring, and $Ar^{13}$ and $Ar^{17}$ may be bonded to each other to form a ring. Furthermore, p represents an integer of 0 to 1000, and preferably represents 0 to 3. Note that the molecular weight of the organic compound represented by General Formula (G1) above is preferably less than or equal to 100000.

The tertiary amine is preferably an organic compound represented by General Formula (G2) below, for example.

[Chemical formula 2]

(G2)

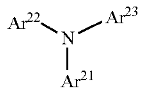

Note that in General Formula (G2) shown above, $Ar^{21}$ to $Ar^{23}$ represent a substituted or unsubstituted aryl groups each having 6 to 14 carbon atoms and may be bonded to each other to form rings. In the case where $Ar^{21}$ to $Ar^{23}$ each a substituent, the substituent may be a group in which a plurality of diarylamino groups or carbazolyl groups are bonded. The organic compound represented by General Formula (G2) above may include an ether bond, a sulfide bond, or a bond via an amine; any of these bonds preferably exists between a plurality of aryl groups, in which case the solubility in a solvent is improved. The organic compound represented by General Formula (G2) above may include an alkyl group as a substituent, in which case the alkyl group may be bonded through an ether bond, a sulfide bond, or a bond via an amine.

<Structural Formula>

As specific examples of the secondary amine, organic compounds represented by Structural Formula (Am2-1) to Structural Formula (Am2-32) below are preferably used. The organic compounds represented by Structural Formula (Am2-1) to Structural Formula (Am2-32) each have an NH group.

[Chemical formula 3]

(Am2-1)

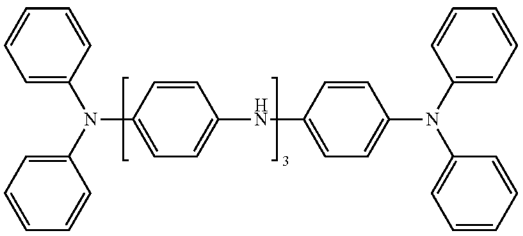

(Am2-2)

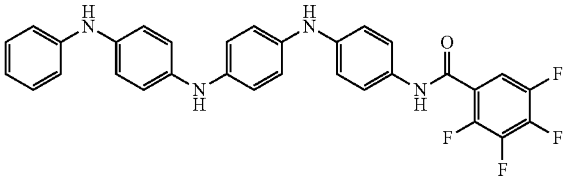

(Am2-3)

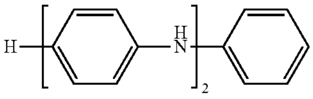

(Am2-4)

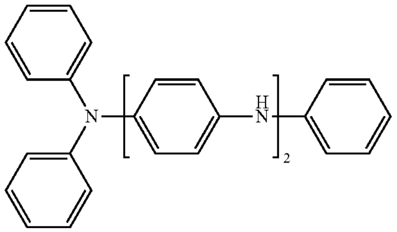

(Am2-5)

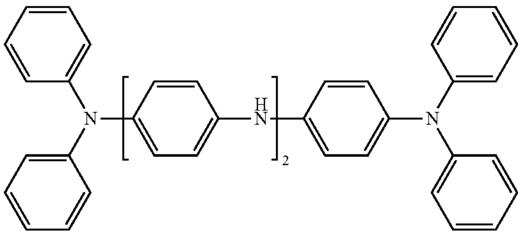

(Am2-6)

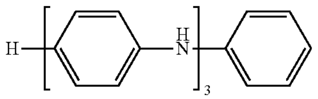

(Am2-7)

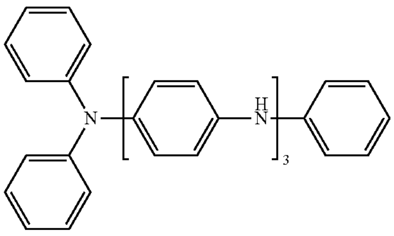

(Am2-8)

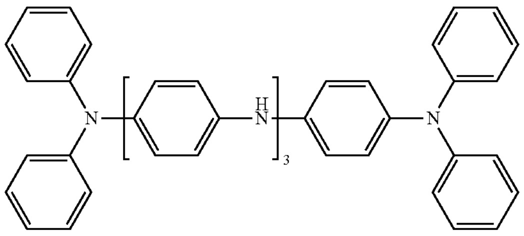

(Am2-9)

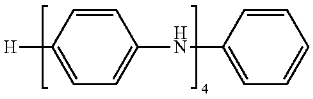

(Am2-10)

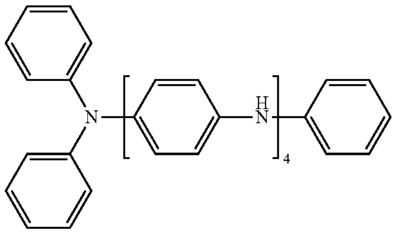

-continued
(Am2-11)
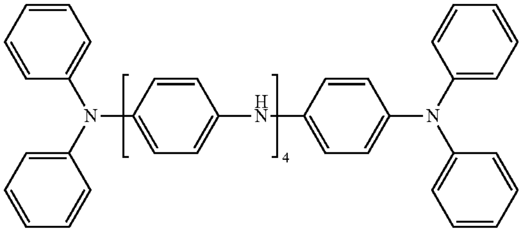
[Chemical formula 4]
(Am2-12)
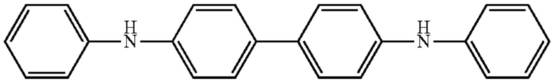
(Am2-13)
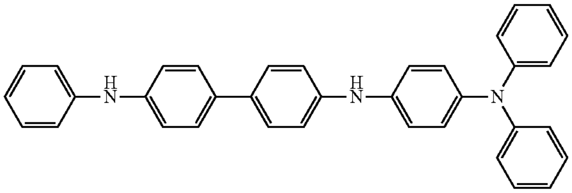
(Am2-14)
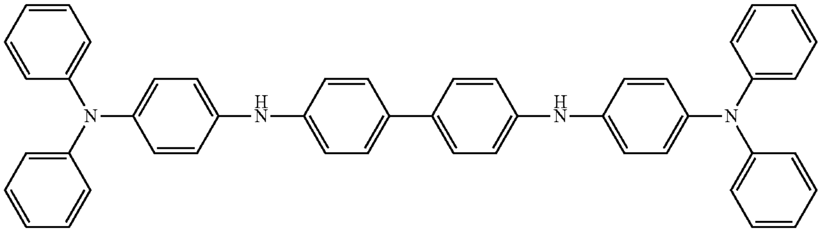
(Am2-15)
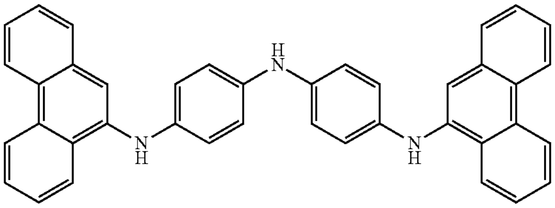
(Am2-16)
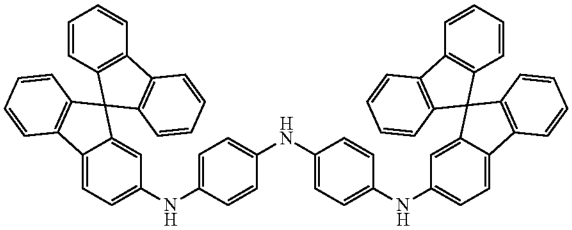
(Am2-17)
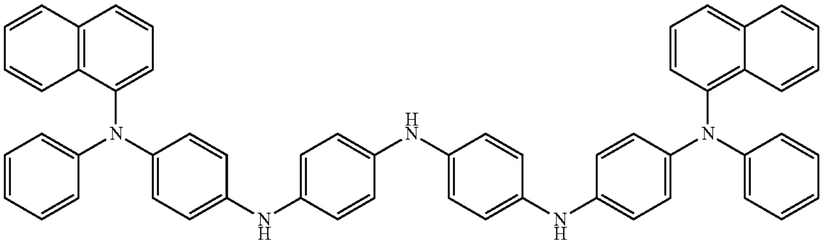
(Am2-18)
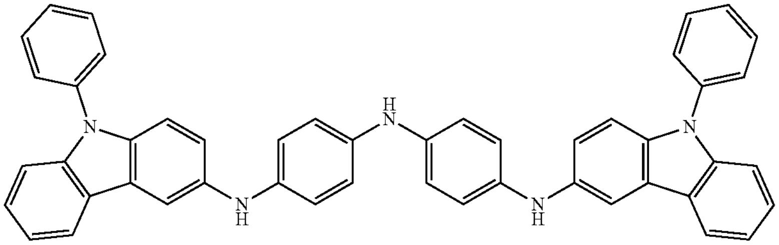

-continued
[Chemical formula 5]
(Am2-19)
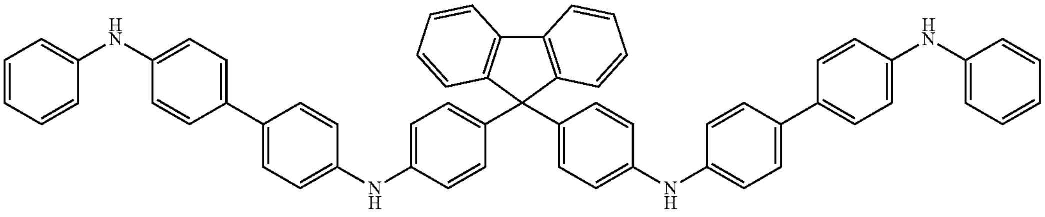
(Am2-20)
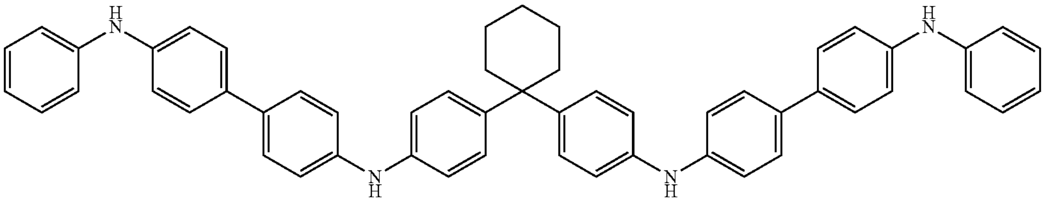
(Am2-21)
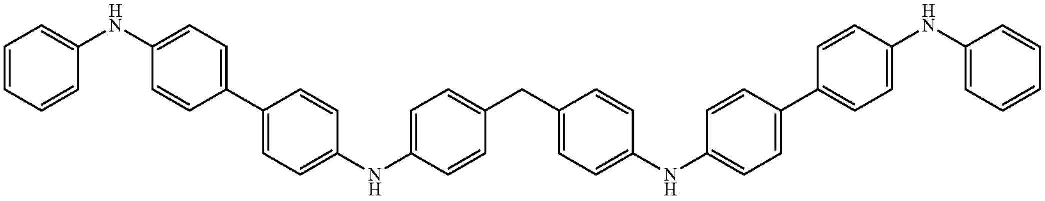
(Am2-22)
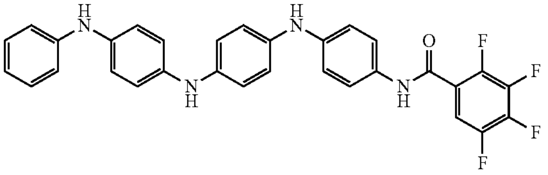
(Am2-23)
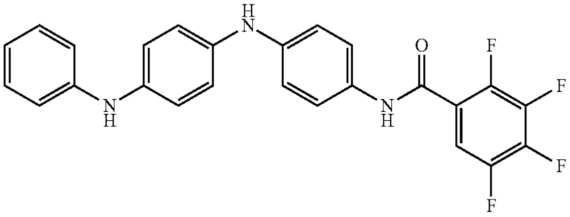
[Chemical formula 6]
(Am2-24)
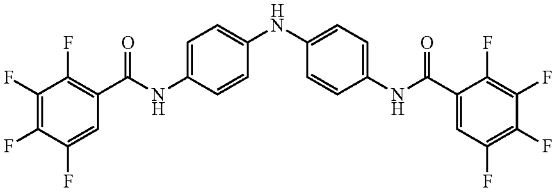
(Am2-25)
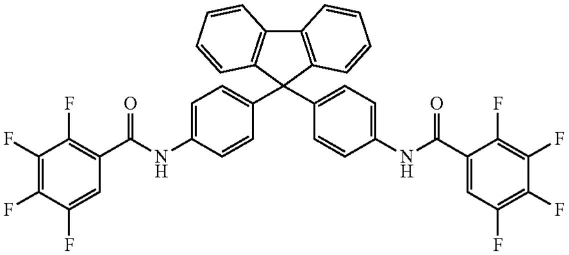
(Am2-26)
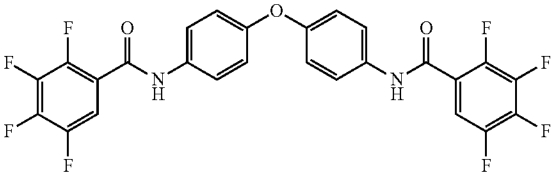
(Am2-27)
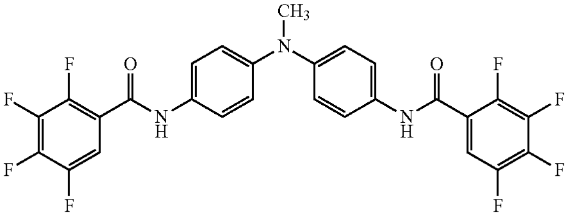

-continued (Am2-28)

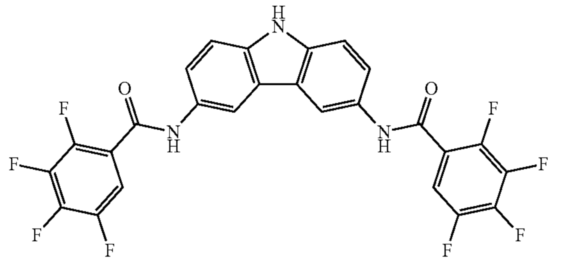

(Am2-29)

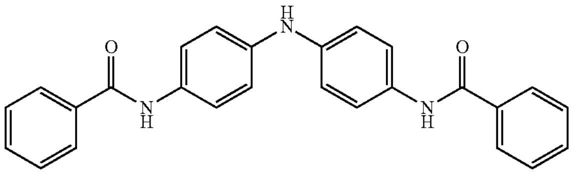

[Chemical formula 7]

(Am2-30)

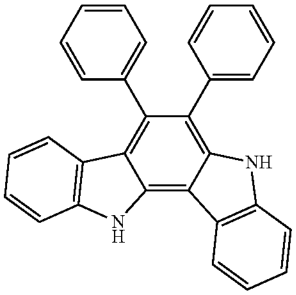

(Am2-31)

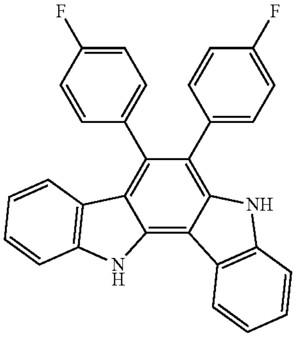

(Am2-32)

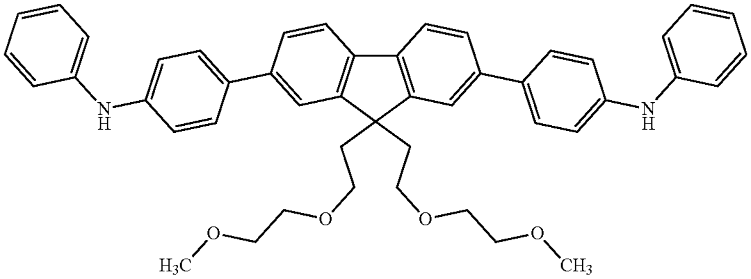

An amine compound can be used for the ink material by being mixed with a sulfonic acid compound. Mixing with a sulfonic acid compound facilitates generation of carriers and improves conductivity. Mixing with a sulfonic acid compound is referred to as p doping in some cases. In the case of using the secondary amine as the amine compound, bondings with a mixed sulfonic acid compound can be formed by a dehydration reaction, or the like, which is preferable. In the case where the compound mixed with the amine compound is a fluoride, a fluoride is preferably used as in Structural Formula (Am2-2), Structural Formulae (Am2-22) to (Am-2-28), or Structural Formula (Am2-31) shown above to improve compatibility.

Note that a thiophene derivative may be used instead of the secondary amine. Specific examples of a thiophene derivative, organic compounds represented by Structural Formula (T-1) to Structural Formula (T-4) shown below, polythiophene, or poly(3,4-ethylenedioxythiophene) (PEDOT) is preferable. A thiophene derivative facilitates generation of carriers and improves conductivity by being mixed with a sulfonic acid compound. Mixing with a sulfonic acid compound is referred to as p doping in some cases.

[Chemical formula 8]

(T-1)

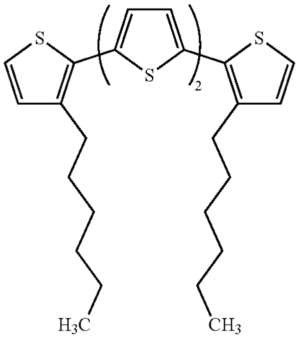

(T-2)

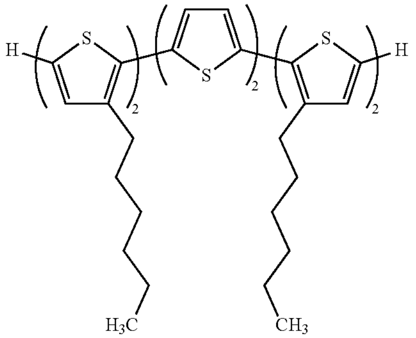

(T-3)

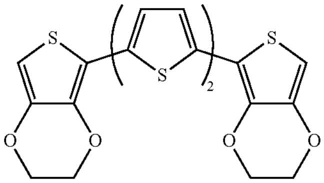

(T-4)

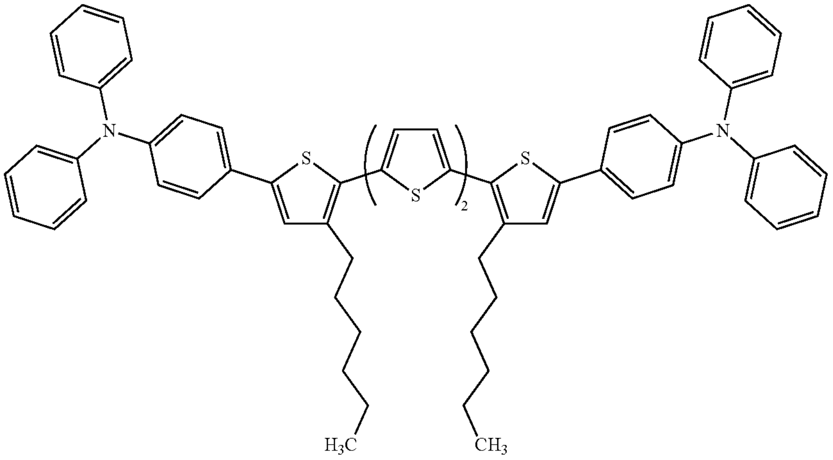

The sulfonic acid compound is a material exhibiting an acceptor property. As a sulfonic acid compound, an arylsulfonic acid can be given. It is only required that the arylsulfonic acid has a sulfo group; a sulfonic acid, a sulfonate, an alkoxysulfonic acid, a halogenated sulfonic acid, or a sulfonic acid anion can be used. Two or more of these sulfo groups may be included. As the aryl group of the arylsulfonic acid, a substituted or unsubstituted aryl group having 6 to 16 carbon atoms can be used. As the aryl group, for example, a phenyl group, a biphenyl group, a naphthyl group, a fluorenyl group, a phenanthrenyl group, an anthryl group, or a pyrenyl group can be used, and a naphthyl group is preferable because it has favorable solubility in a solvent and a favorable transport property. The arylsulfonic acid may include two or more of the aryl groups. These arylsulfonic acid preferably includes a plurality of aryl groups substituted by fluorine because the LUMO level can be adjusted to be deep (in the negative direction widely). The arylsulfonic acid may include an ether bond, a sulfide bond, or a bond via an amine; any of these bonds preferably exists between a plurality of aryl groups, in which case the solubility in a solvent is improved. Also when the arylsulfonic acid includes an alkyl group as a substituent, the alkyl group may be bonded through an ether bond, a sulfide bond, or a bond via an amine. The arylsulfonic acid may be substituted in part of a polymer. As the polymer, polyethylene, nylon, polystyrene, or polyfluorenylene can be used; polystyrene or polyfluorenylene is preferred because of its favorable conductivity.

Specific and preferred examples of compounds including the arylsulfonic acid (arylsulfonic acid compounds) include organic compounds represented by Structural Formula (S-1) to Structural Formula (S-15) below. A polymer having a sulfo group such as poly(4-styrenesulfonic acid) (PSS) can also be used. Electrons from an electron donor with a shallow HOMO (such as an amine compound, a carbazole compound, or a thiophene compound) can be accepted by using an arylsulfonic acid compound, and the property of hole injection or hole transport from an electrode can be obtained by mixing with an electron donor. When the arylsulfonic acid compound is a fluorine compound, the LUMO level can be adjusted to be deeper (the energy level can be higher in the negative direction).

[Chemical formula 9]
(S-1)
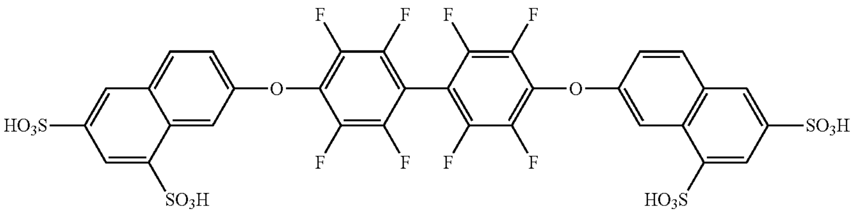
(S-2)
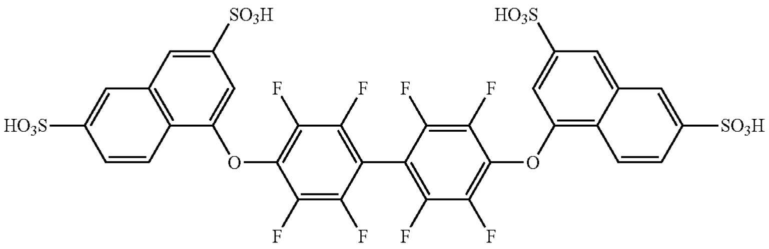
(S-3)
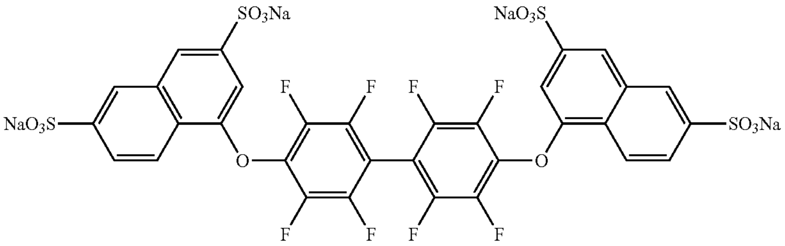
(S-4)
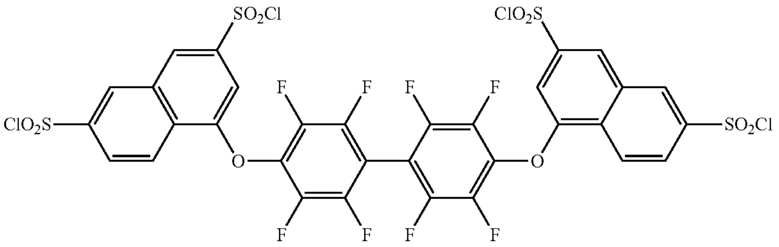
(S-5)
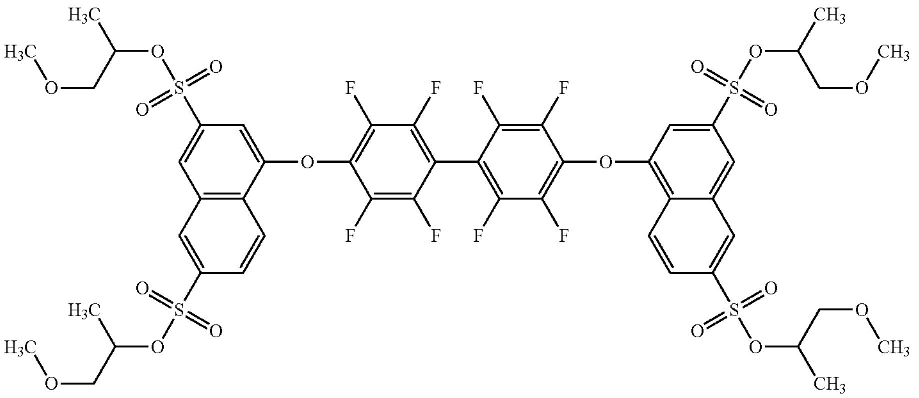

-continued
[Chemical Formula 10]
(S-6)
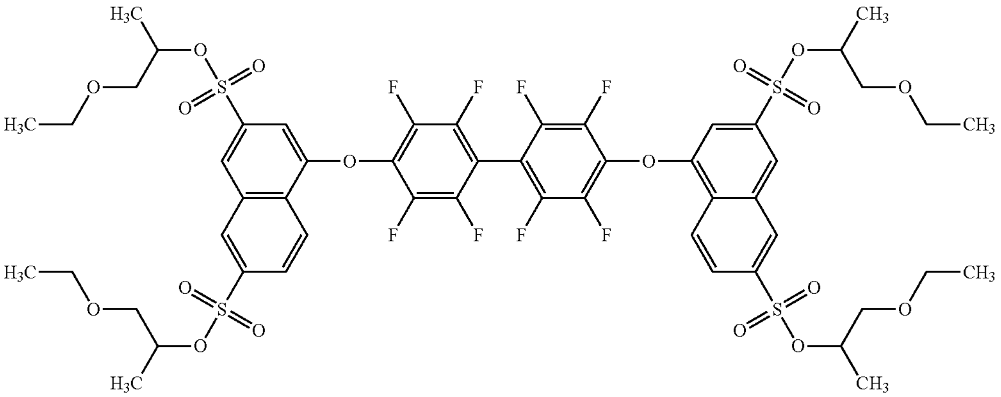
(S-7)
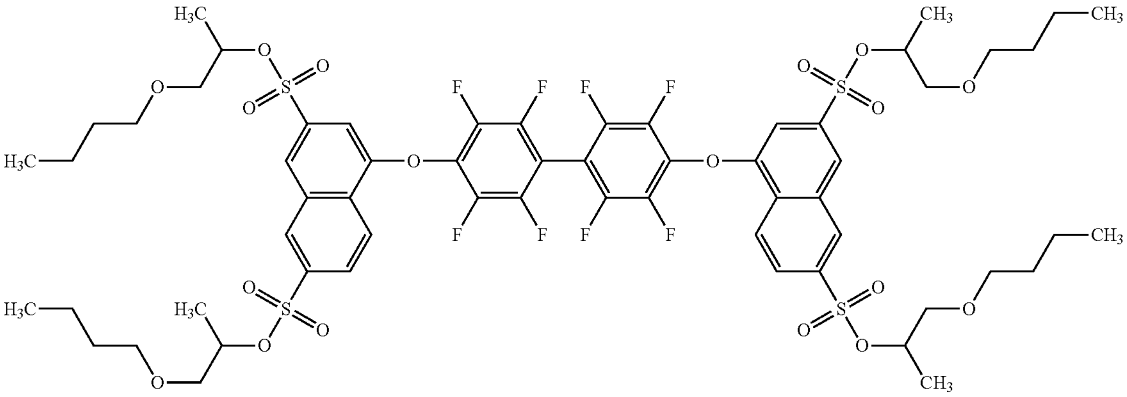
(S-8)
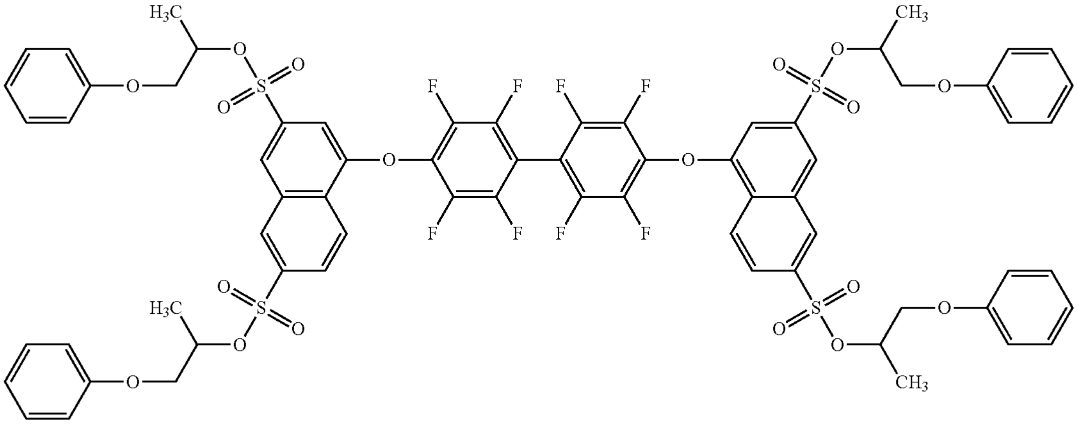
(S-9)
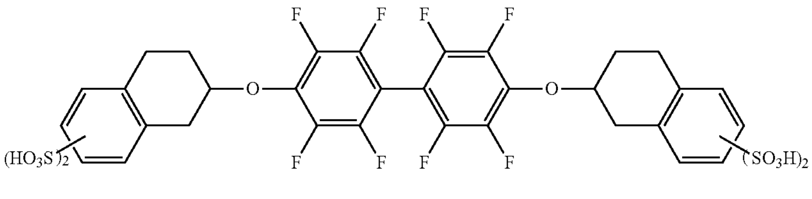

-continued

[Chemical formula 11]

(S-10)

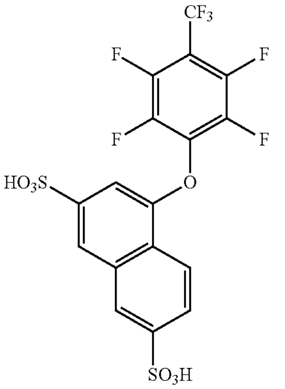

(S-11)

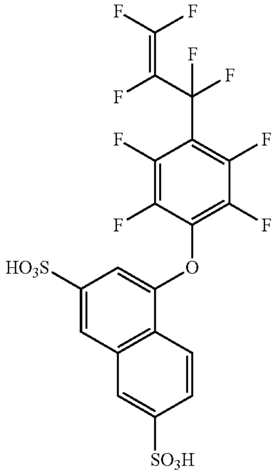

(S-12)

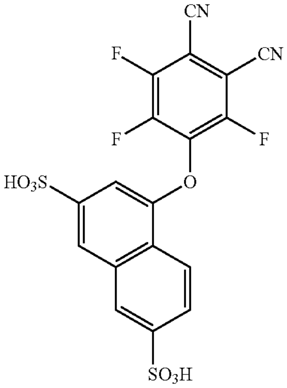

(S-13)

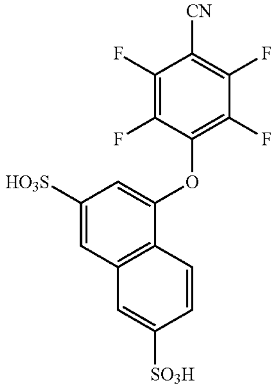

[Chemical formula 12]

(S-14)

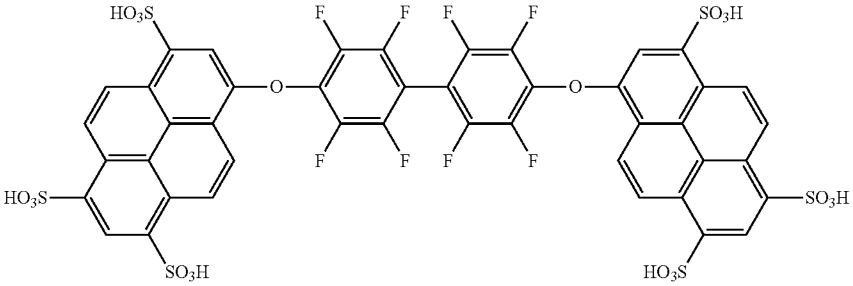

(S-15)

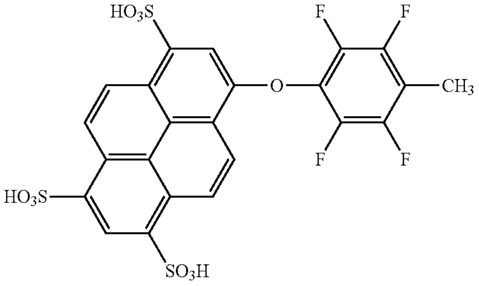

A tertiary amine may further be mixed into the ink material mixing a secondary amine and sulfonic acid. A tertiary amine is electrochemically and photochemically stable as compared to a secondary amine and thereby enables a favorable hole-transport property when mixed. As the tertiary amine, for example, organic compounds represented by Structural Formula (Am3-1) to Structural Formula (Am3-7) shown below are preferable. A material having a hole-transport property other than a tertiary amine may be mixed as appropriate into the ink material.
[Chemical formula 13]
(Am3-1)
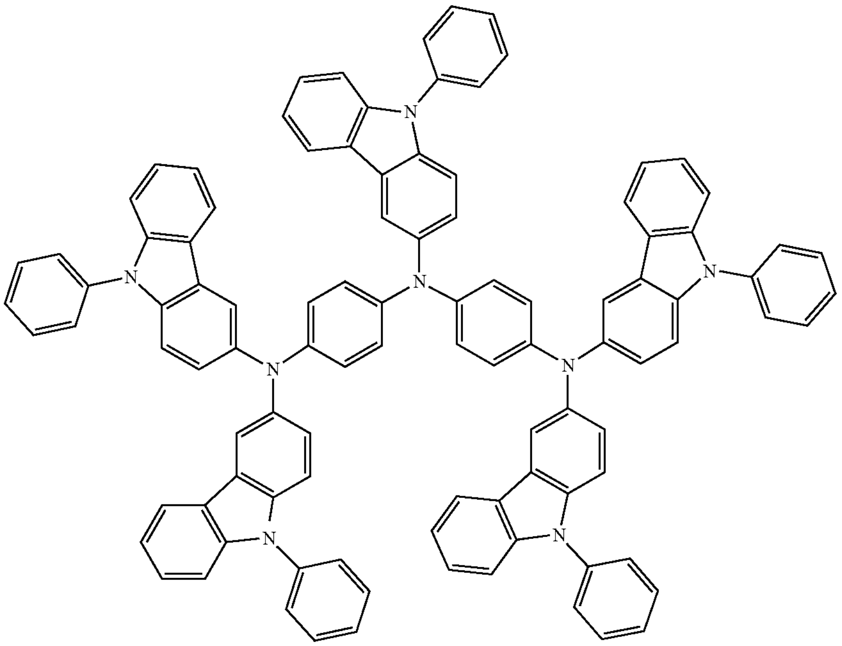
(Am3-2)
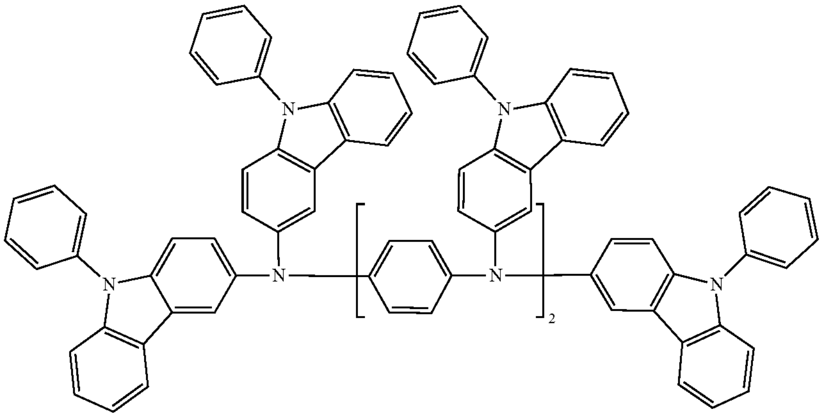

-continued
[Chemical formula 14]
(Am3-3)
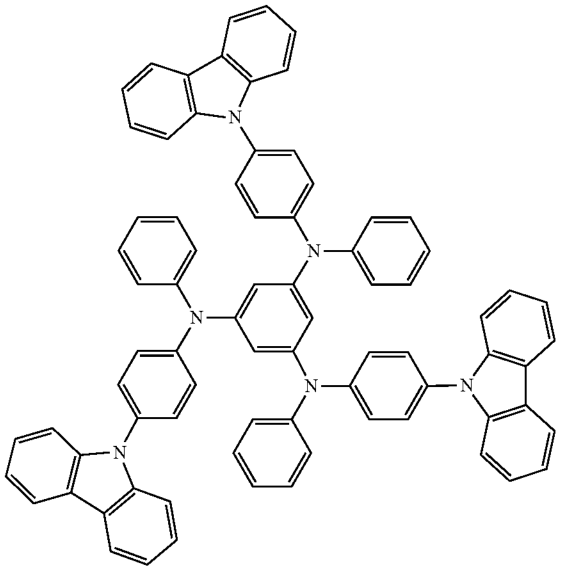
(Am3-4)
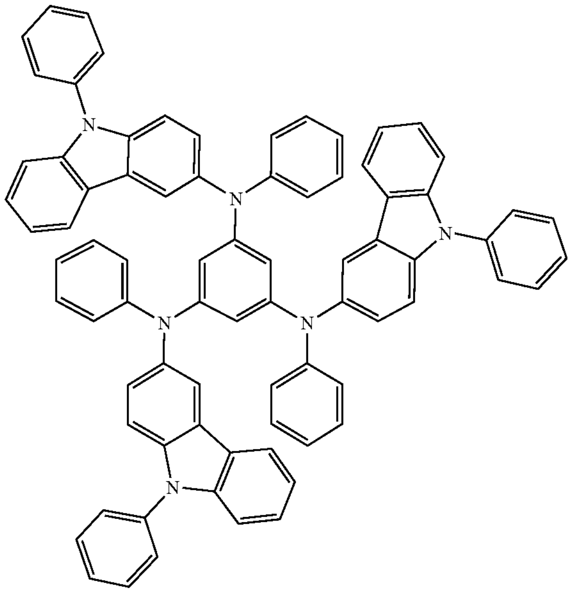
(Am3-5)
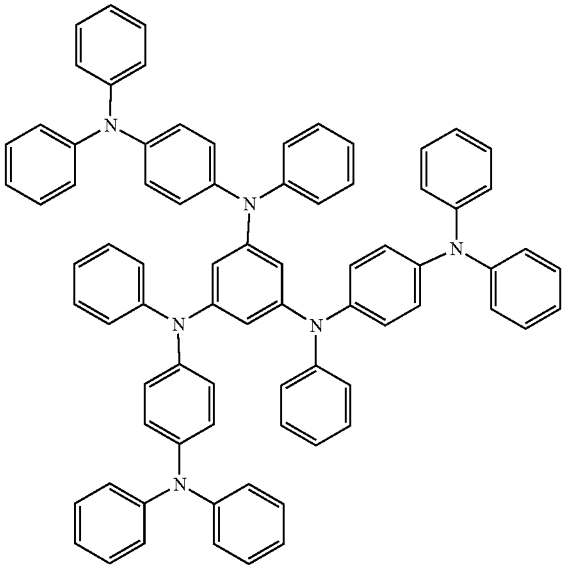
(Am3-6)
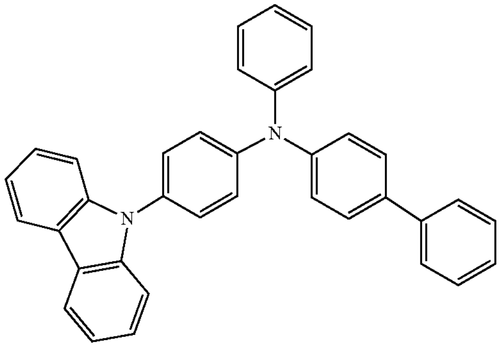

-continued (Am3-7)

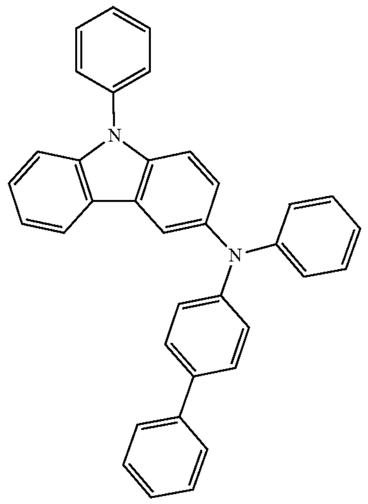

Other than the arylsulfonic acid compound, a cyano compound such as a tetracyanoquinodimethane compound can be used as an electron acceptor. Specifically, 2,3,5,6-tetrafluoro-7,7,8,8-tetracyano-quinodimethane (F4TCNQ), dipyrazino[2,3-f:2',3'-h]quinoxaline-2,3,6,7,10,11-hexacarbonitrile (HAT-CN6), or the like can be given.

Note that the ink material in which a monomer is mixed preferably includes one or both of a 3,3,3-trifluoropropyltrimethoxysilane compound and a phenyltrimethoxysilane compound because the wettability can be improved when deposited in a wet method.

When a layer deposited by a wet process with the ink material including at least two monomers of an electron donor such as the secondary amine or thiophene and arylsulfonic acid is measured by ToF-SIMS, a signal is observed at around m/z=80 in a negative-mode result. The m/z=80 corresponds to a signal derived from an $SO_3$ anion in arylsulfonic acid. By contrast, a signal derived from an amine monomer is less likely to be observed from the above layer. Meanwhile, sufficient light emission by the light-emitting element including the layer gives evidence that the layer has a sufficient hole-transport property. If a light-emitting element capable of light emission shows the analysis results including the signal and the like described above, the layer is found to have a sufficient hole-transport property, and the absence of the observed skeletons having a hole-transport property such as an amine suggests that the monomers are bonded to each other to form a high molecular weight compound film. These analysis results mean that the layer is formed by a wet process.

A sulfonic acid compound represented by Structural Formula (S-1) or (S-2) shown above is preferable because the sulfonic acid compound has many sulfo groups and a three-dimensional bonding with an amine compound can be formed, so that film quality is likely to be stable. With the layer formed by using an arylsulfonic acid compound, a signal at m/z=901 can be observed in a negative mode in addition to the above signal of m/z=80. In addition, a signal at around m/z=328 can be observed as a product ion.

<Light-Emitting Material>

Note that in the light-emitting element of one embodiment of the present invention, it is particularly preferable that the iridium complex represented by a structural formula shown below be used as a light-emitting material. The iridium complex shown below is preferable because it has an alkyl group, so that it can easily be dissolved in a solvent and make it easy to adjust ink material.

[Chemical formula 15]

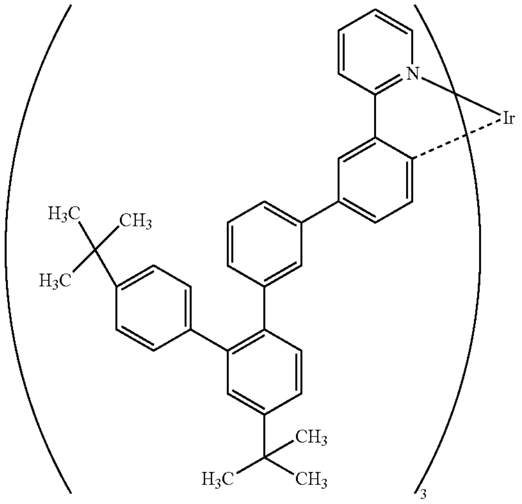

When the light-emitting layer containing the iridium complex represented by the above structural formula is measured by ToF-SIMS, it has been found that a signal appears at m/z=1676, or m/z=1181 and m/z=685 each of which corresponds to a product ion, in the result of a positive mode.

<Top-Emission Structure>

Figure 5E:
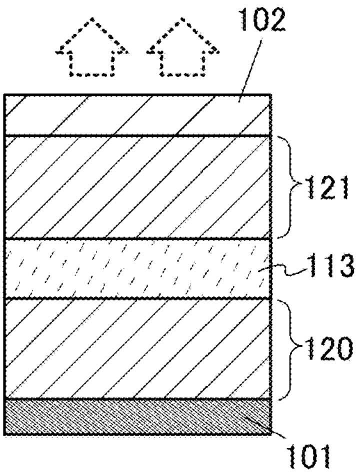

FIG. 5E shows an example of a top-emission structure, in which the light extraction direction is denoted by upward arrows. The top-emission structure enables an increase in aperture ratio because of no need to consider the arrangement of semiconductor elements. In the top-emission structure, the anode 101 corresponds to the first substrate 760 illustrated in FIG. 1 and the like.

<Bottom-Emission Structure>

Figure 5F:
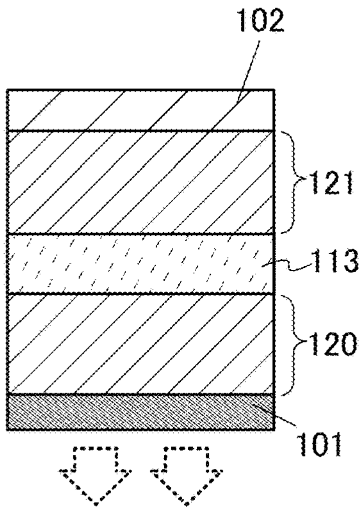

FIG. 5F shows an example of a bottom-emission structure, in which the light extraction direction is denoted by downward arrows. The bottom-emission structure enables a high aperture ratio to be maintained by employing semiconductor elements with a good light-transmitting property, though the arrangement of the semiconductor elements formed on the first substrate 760 should be considered. Also in the bottom-emission structure, the anode 101 corresponds to the first substrate 760 illustrated in FIG. 1 and the like.

The description in this embodiment can be used in combination with the other embodiments.

Embodiment 2

A second manufacturing method of a display panel of one embodiment of the present invention is described. In a manufacturing method of a display panel according to one embodiment of the present invention, an organic compound layer included in a light-emitting element is formed by a wet process. The second manufacturing method is described with a spin coating method as an example of a wet process. A spin coating method is preferable because a thin film can be uniformly formed over a large-sized substrate. In a spin coating method, a droplet is applied throughout the entire display region. As the second manufacturing method, a manufacturing method of a display panel in the case where a droplet is applied throughout the entire display region is described. It is needless to say that the organic compound layer included in the light-emitting element may be formed by a wet process other than a spin coating method.

Figure 2A:
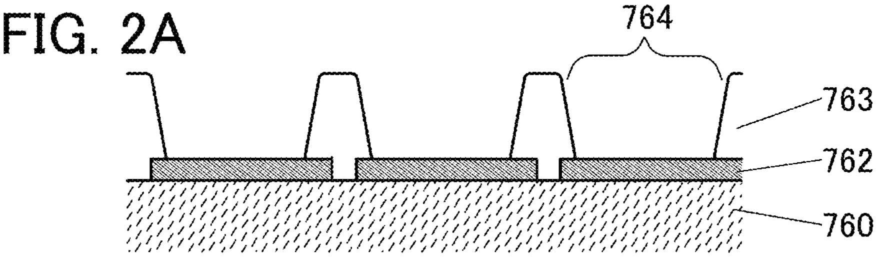
FIG. 2A to FIG. 2D are diagrams illustrating a manufacturing method of a display panel according to an embodiment.

As illustrated in FIG. 2A, the first electrode 762 and the insulator 763 are formed over the first substrate 760, and the opening portion 764 is formed in the insulator 763 so as to expose the first electrode 762. For the other structures and the like, the above description with reference to FIG. 1A and the like can be referred to.

Figure 2B:
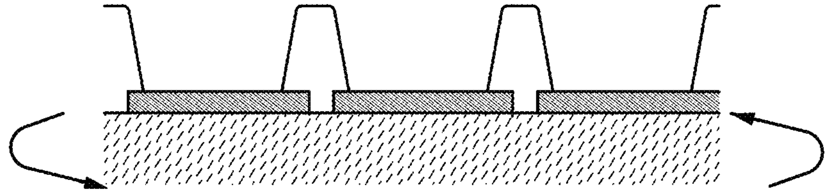

The first substrate 760 is coated with a liquid containing an organic compound by a spin coating method while being rotated as illustrated in FIG. 2B. For the other structures and the like, the above description with reference to FIG. 1B and the like can be referred to.

Figure 2C:
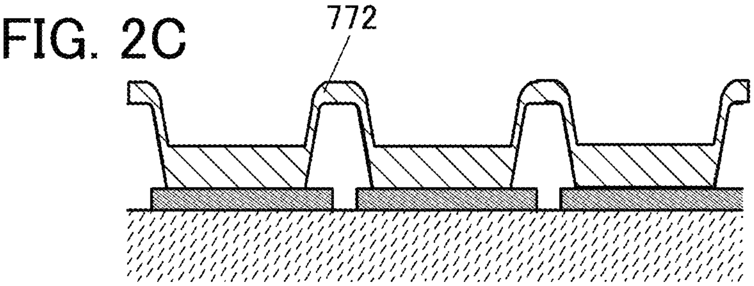

The liquid coats the whole display region. In other words, the liquid coating at least lies over a plurality of opening portions and forms the material layer 772 as illustrated in FIG. 2C.

Figure 2D:
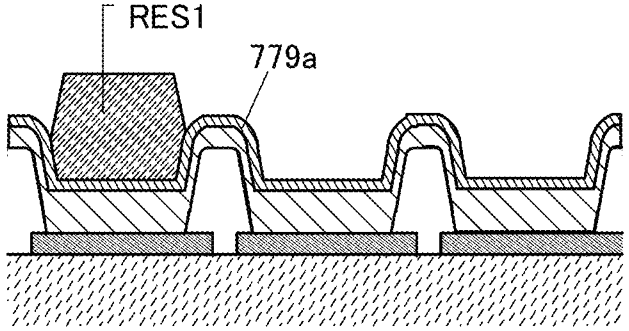

Then, as illustrated in FIG. 2D, the first resist mask RES1 is formed after the formation of a mask layer 779*a* and then the material layer 772 is processed. For the other structures and the like, the above description with reference to FIG. 1D and the like can be referred to. The mask layer 779*a* is a layer that is to be removed later. The mask layer 779*a* can be formed of a material containing a metal element, a metal compound, silicon, a silicon oxide, or a silicon nitride.

Figure 3A:
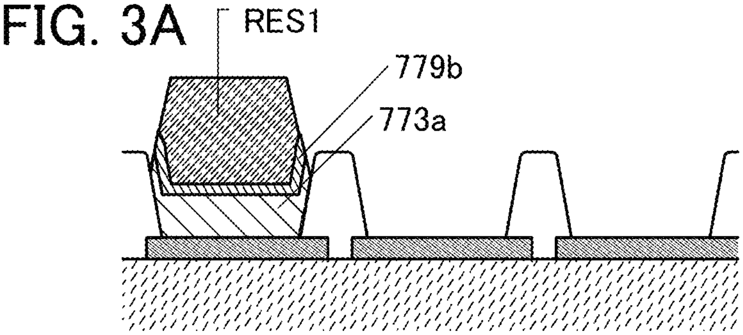
FIG. 3A to FIG. 3D are diagrams illustrating a manufacturing method of a display panel according to an embodiment.

As illustrated in FIG. 3A, the material layer 773*a* processed using the first resist mask RES1 is obtained. At this time, the mask layer 779*a* is also processed to be a mask layer 779*b*. For the other structures and the like, the above description with reference to FIG. 1E and the like can be referred to.

Figure 3B:
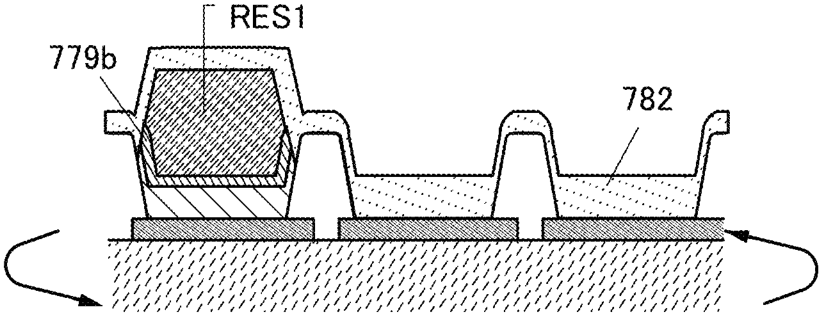

Then, as illustrated in FIG. 3B, the first substrate 760 is coated with the liquid containing an organic compound of a light-emitting element by a spin coating method while being rotated, with the first resist mask RES1 and the mask layer 779*b* remaining. Since the first resist mask RES1 and the mask layer 779*b* remain, the material layer 773*a* can be prevented from being exposed in later processing. In the case where the material layer 773*a* cannot have etching selectivity with respect to the material layer 782, one or both of the first resist mask RES1 and the mask layer 779*b* may function as a stopper in etching.

It is needless to say that coating with the liquid containing an organic compound of a light-emitting element may be performed with the state in which the first resist mask RES1 is removed or the first resist mask RES1 and the mask layer 779*b* are removed.

Figure 3C:
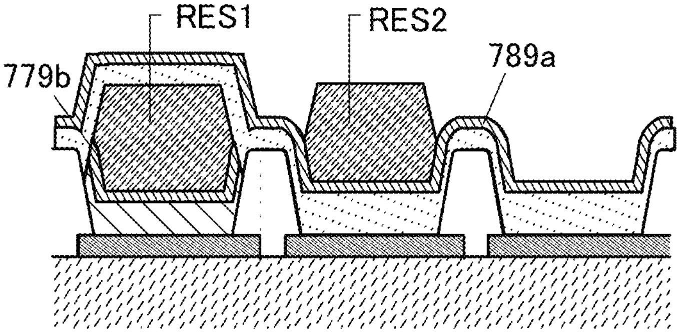

Then, as illustrated in FIG. 3C, the second resist mask RES2 is formed after the formation of a mask layer 789*a* and then the material layer 782 is processed. For the other structures and the like, the above description with reference to FIG. 1D and the like can be referred to. A mask layer 789*a* can be formed in a manner similar to that of the mask layer 779*a*.

Figure 3D:
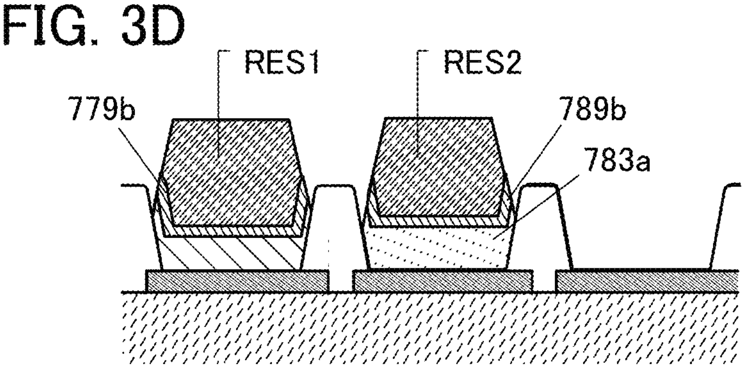

As illustrated in FIG. 3D, the material layer 783*a* processed using the second resist mask RES2 is obtained. At this time, the mask layer 789*a* is also processed to be a mask layer 789*b*. For the other structures and the like, the above description with reference to FIG. 1E and the like can be referred to.

Figure 4A:
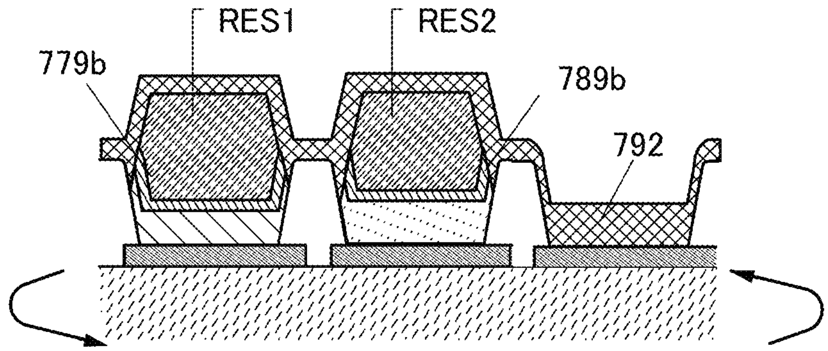
FIG. 4A to FIG. 4D are diagrams illustrating a manufacturing method of a display panel according to an embodiment.

As illustrated in FIG. 4A, the first substrate 760 is coated with the liquid containing an organic compound of a light-emitting element by a spin coating method while being rotated, with the first resist mask RES1, the mask layer 779*b*, the second resist mask RES2, and the mask layer 789*b* remaining without being removed. Since the first resist mask RES1, the mask layer 779*b*, the second resist mask RES2, and the mask layer 789*b* remain, the material layer 773*a* and the material layer 783*a* can be prevented from being exposed in later processing. In the case where the material layer 773*a* and the material layer 783*a* cannot have etching selectivity with respect to the material layer 792, any one or all of the first resist mask RES1, the mask layer 779*b*, the second resist mask RES2, and the mask layer 789*b* may function as a stopper in etching.

It is needless to say that coating with the liquid containing an organic compound of a light-emitting element may be performed with the state in which the first resist mask RES1 and the second resist mask RES2 are removed or the first resist mask RES1, the mask layer 779*b*, the second resist mask RES2, and the mask layer 789*b* are removed.

Figure 4B:
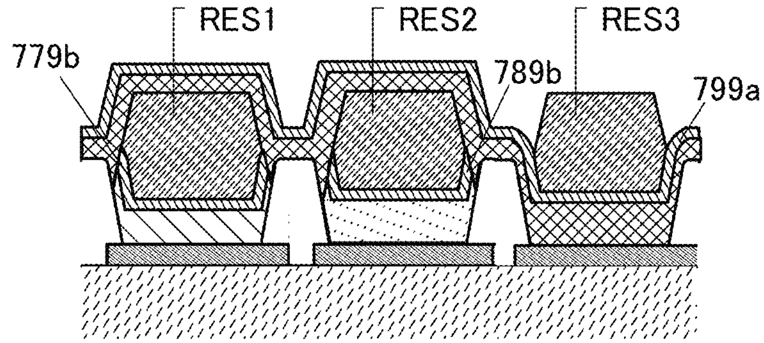

As illustrated in FIG. 4B, the third resist mask RES3 is formed after the formation of a mask layer 799*a* and then the material layer 792 is processed. For the other structures and the like, the above description with reference to FIG. 1D and the like can be referred to. A mask layer 799*a* can be formed in a manner similar to that of the mask layer 779*a*.

Figure 4C:
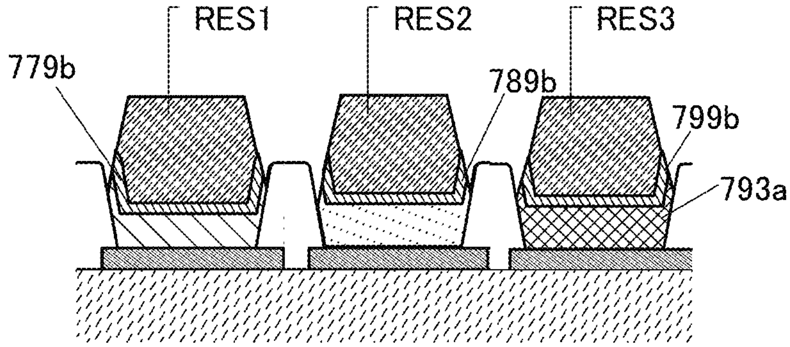

As illustrated in FIG. 4C, the material layer 793*a* processed using the third resist mask RES3 is obtained. At this time, the mask layer 799*a* is also processed to be a mask layer 799*b*. For the other structures and the like, the above description with reference to FIG. 1E and the like can be referred to.

Figure 4D:
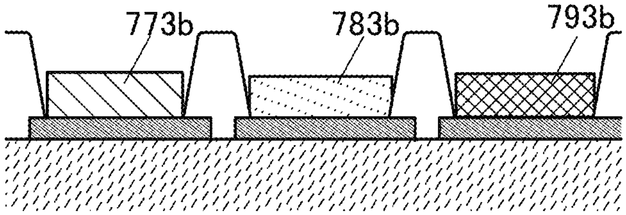

After the first resist mask RES1 to the third resist mask RES3, the mask layer 779*b*, the mask layer 789*b*, and the mask layer 799*b* are removed, the material layer 773*b*, the material layer 783*b*, and the material layer 793*b* that undergo minute processing can be obtained as illustrated in FIG. 4D.

For example, the material layer 773*b* can be for a red light-emitting element, the material layer 783*b* can be for a green light-emitting element, and the material layer 793*b* can be for a blue light-emitting element. Such a structure by separate formation may be referred to as an SBS (Side By Side) structure. Although the structure having three colors is described as an example, one embodiment of the present invention is not limited thereto. For example, the structure may have four or more colors.

According to the above-described manufacturing method, a high-resolution display panel with less crosstalk can be provided.

The description in this embodiment can be used in combination with the other embodiments.

Embodiment 3

In this embodiment, manufacturing methods of a display panel are described using flow charts.

<Manufacturing Method 1A>

Figure 6A:
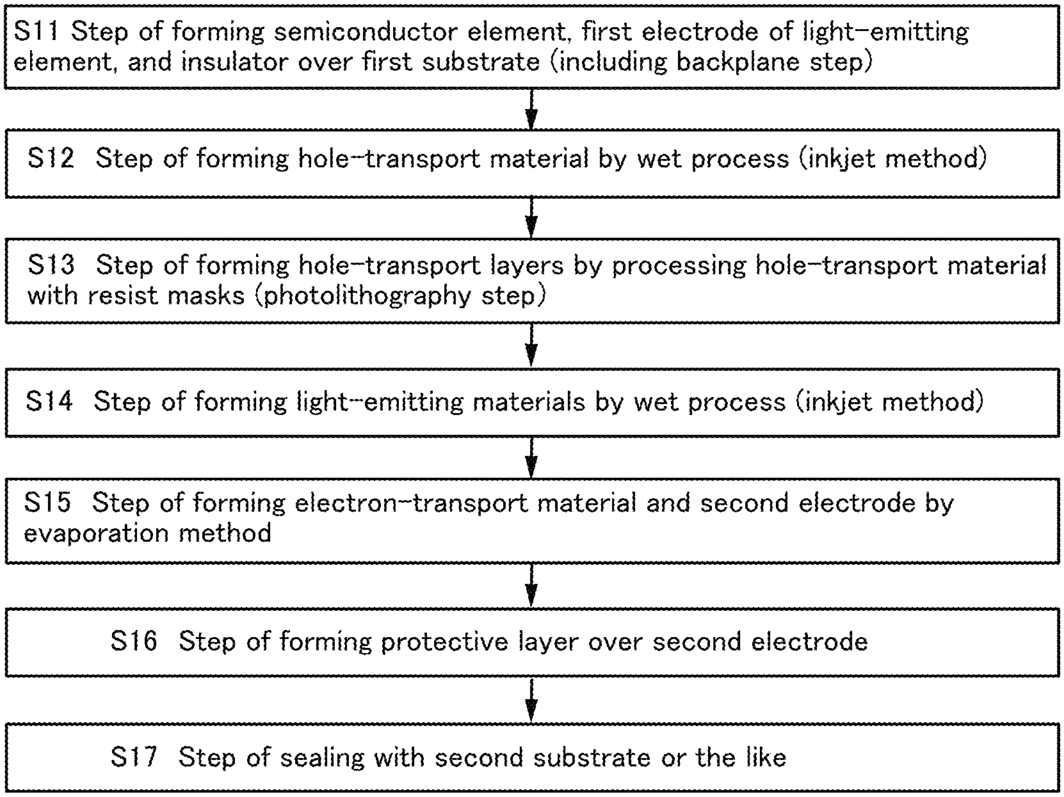
FIG. 6A, and FIG. 6B are diagrams illustrating manufacturing methods of a display panel according to an embodiment.

As illustrated in Step S11 in FIG. 6A, the semiconductor element, the first electrode 762 of the light-emitting element, and the insulator 763 with the opening portion 764 are formed on the first substrate 760. Such Step S11 includes a fabrication step of the semiconductor element, i.e., a backplane step.

Next, as illustrated in Step S12 in FIG. 6A, a layer including a hole-transport material is fabricated by a wet process. For example, the layer can be fabricated by the inkjet method described in Embodiment 1. Since the layer including a hole-transport material can be used in common in the light-emitting elements, the layer including a hole-transport material may be formed throughout the display region.

Next, as illustrated in Step S13 in FIG. 6A, the layer including a hole-transport material is processed using a resist mask, thereby forming the hole-transport layers of the light-emitting elements. That is, a so-called photolithography step is conducted in Step S13. When the layer including a hole-transport material is formed in the display region in Step S12, the layer including a hole-transport material is formed also on the upper surface of the insulator 763. The layer including a hole-transport material in an unnecessary region such as the upper surface of the insulator 763 is preferably removed. Hence, the resist mask is preferably formed for each light-emitting element.

Next, as illustrated in Step S14 in FIG. 6A, layers including light-emitting materials are fabricated by a wet process. For example, the layers can be fabricated by the inkjet method described in Embodiment 1. To prevent color mixing, a plurality of nozzles are preferably used for application in such a manner that the droplets of the respective light-emitting materials do not overlap with each other.

Next, as illustrated in Step S15 in FIG. 6A, a layer including an electron-transport material and a second electrode are formed. Although an evaporation method is used in Step S15, a wet process may be used.

Next, as illustrated in Step S16 in FIG. 6A, a protective layer is formed over the second electrode. The protective layer can be formed by a sputtering method or a plasma CVD method. The protective layer preferably includes an inorganic material, and silicon oxide, silicon nitride, silicon oxynitride, or aluminum oxide can be used. A stacked structure in which layers of these materials are stacked may be used for the protective layer.

Next, as illustrated in Step S17 in FIG. 6A, sealing is performed with a second substrate. A solid sealing structure, a hollow sealing structure, or the like can be employed for the sealing. The solid sealing structure is a structure in which sealing is performed with an adhesive such as an organic resin. In the solid sealing structure, the second substrate can be omitted. The hollow sealing structure is a sealing structure in which the surrounded space is filled with an inert gas (nitrogen, argon, or the like).

<Manufacturing Method 1B>

A manufacturing method 1B different from the above manufacturing method 1A is described.

Figure 6B:
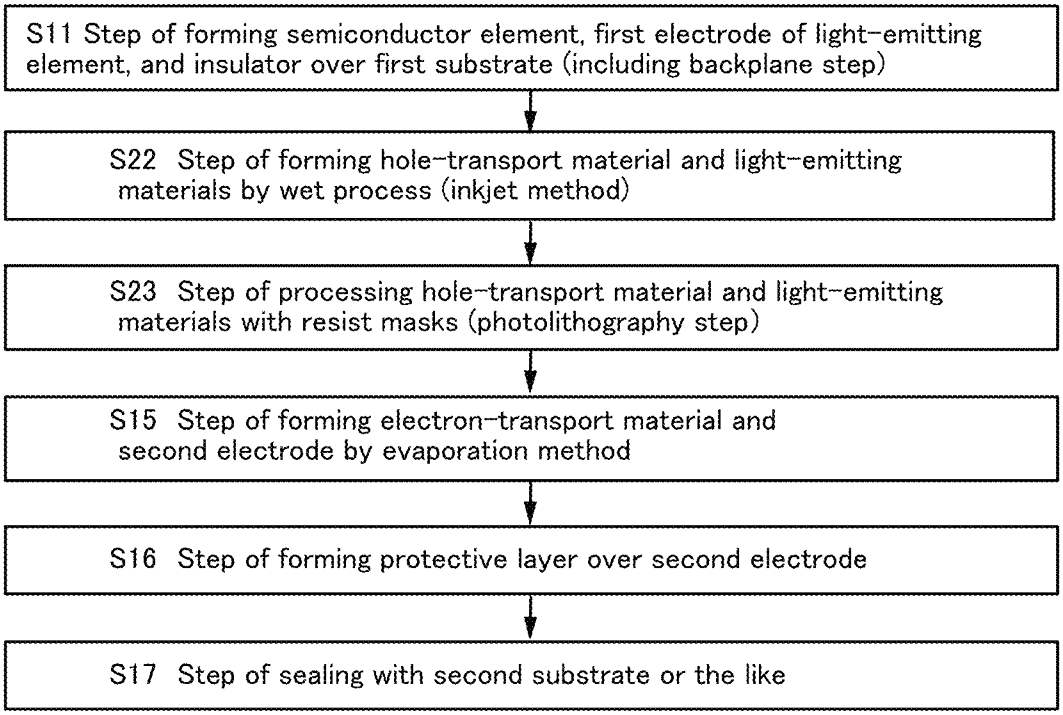

Step S11 in FIG. 6B is similar to Step S11 in FIG. 6A.

Next, Step S22 in FIG. 6B includes the step of forming the layer including a hole-transport material by a wet process and the step of forming the layers including light-emitting materials by a wet process. A so-called photolithography step is not conducted in Step S22. The step of forming the layer including a hole-transport material by a wet process is similar to Step S12 in FIG. 6A. The step of forming the layers including light-emitting materials by a wet process is similar to Step S14 in FIG. 6A.

Next, in Step S23 in FIG. 6B, a so-called photolithography step is performed on the layer including a hole-transport material and the layers including light-emitting materials. The photolithography step is similar to Step S13 in FIG. 6A. The photolithography step can remove the layer including a hole-transport material and the like that is formed in an unnecessary region.

Step S15, Step S16, and Step S17 in FIG. 6B are next conducted and respectively similar to Step S15, Step S16, and Step S17 in FIG. 6A.

<Second Manufacturing Method>

The second manufacturing method different from the above manufacturing method 1A and the above manufacturing method 1B is described.

Figure 7:
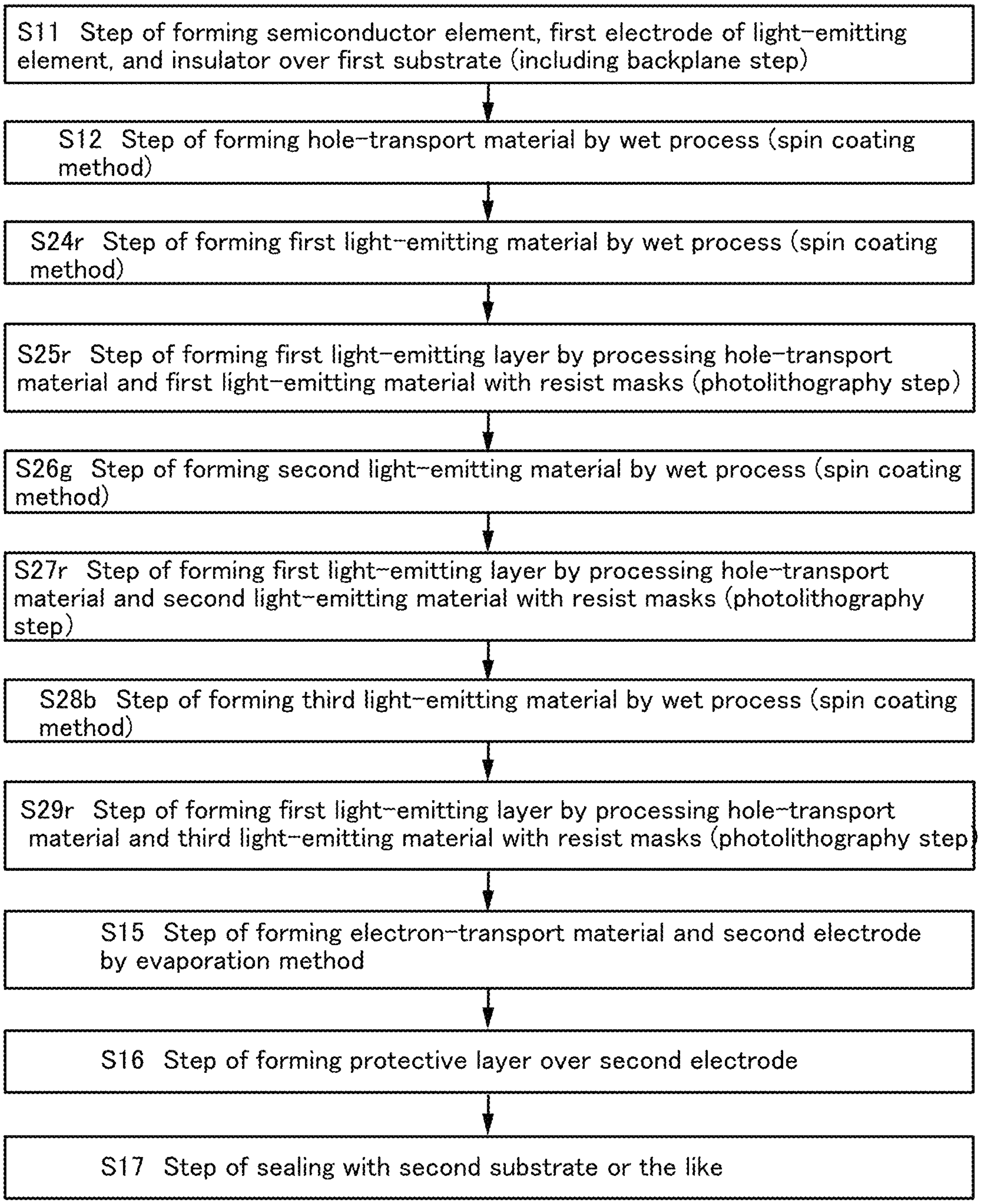
FIG. 7 is a diagram illustrating a manufacturing method of a display panel according to an embodiment.

Step S11 and Step S12 in FIG. 7 are respectively similar to Step S11 and Step S12 in FIG. 6A.

Next, in Step S24*r* in FIG. 7, a layer including a light-emitting material included in a first light-emitting layer (a first light-emitting material) is fabricated by a wet process. For example, the layer can be fabricated by the spin coating method described in Embodiment 2.

Next, in Step S25*r* in FIG. 7, a so-called photolithography step is performed on the layer including a hole-transport material and the layer including the first light-emitting material. The layer including the first light-emitting material formed by a wet process is sometimes formed beyond the desired region. Hence, a so-called photolithography step is preferably conducted after the layer including the first light-emitting material is formed by a wet process. Here, the previously formed layer including a hole-transport material may also be processed at the same time. In this case, the processing can proceed to the next step without removing the resist mask that is provided in processing the layer including the first light-emitting material.

Next, in Step S26*g* in FIG. 7, a layer including a light-emitting material included in a second light-emitting layer (a second light-emitting material) is fabricated by a wet process. For example, the layer can be fabricated by the spin coating method described in Embodiment 2.

Next, in Step S27*r* in FIG. 7, a so-called photolithography step is performed on the layer including a hole-transport material and the layer including the second light-emitting material. The layer including the second light-emitting material formed by a wet process is sometimes formed beyond the desired region. Hence, a so-called photolithography step is preferably conducted after the layer including the second light-emitting material is formed by a wet process. At this time, the previously formed layer including a hole-transport material may also be processed at the same time. When there remains the resist mask provided in processing the layer including the first light-emitting material, the first light-emitting layer can be protected in this step. Here, the processing can proceed to the next step without removing the resist mask that is provided in processing the layer including the second light-emitting material.

Next, in Step S28*b* in FIG. 7, a layer including a light-emitting material included in a third light-emitting layer (a third light-emitting material) is fabricated by a wet process. For example, the layer can be fabricated by the spin coating method described in Embodiment 2.

Next, in Step S29*r* in FIG. 7, a so-called photolithography step is performed on the layer including a hole-transport material and the layer including the third light-emitting material. The layer including the third light-emitting material formed by a wet process is sometimes formed beyond the desired region. Hence, a so-called photolithography step is preferably conducted after the layer including the third light-emitting material is formed by a wet process. At this time, the previously formed layer including a hole-transport material may also be processed at the same time. When there remain the resist masks provided in processing the layer including the first light-emitting material and the layer including the second light-emitting material, the first light-emitting layer and the second light-emitting layer can be protected in this step.

Preferably, the resist masks are all removed after the above three photolithography steps are conducted.

Step S15, Step S16, and Step S17 in FIG. 7 are next conducted and respectively similar to Step S15, Step S16, and Step S17 in FIG. 6A.

The description in this embodiment can be used in combination with the other embodiments.

Embodiment 4

In this embodiment, a display module of one embodiment of the present invention is described.

Figure 8A:
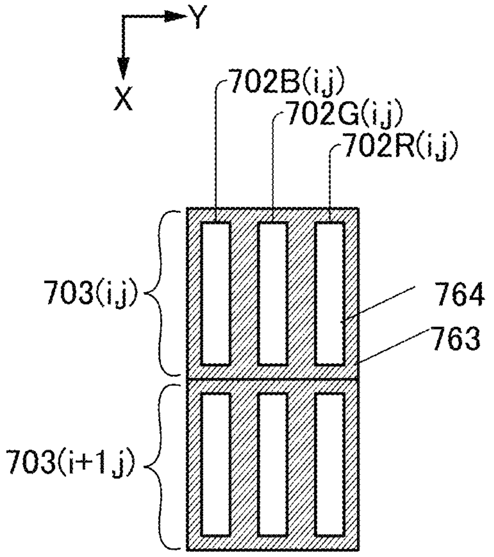
FIG. 8A and FIG. 8B are diagrams illustrating a structure of a display panel according to an embodiment.

FIG. 8A illustrates a top view of the insulator 763 provided with the opening portions 764 in the display panel. In FIG. 8A, two pixels (a pixel 703(*i,j*) and a pixel 703(*i*+1,j)) are illustrated, and the pixel 703(*i*+1j) is adjacent to the pixel 703(*i,j*) in the x-axis direction. The pixel 703(*i,j*) includes a red pixel 702R(i,j), a green pixel 702G(i,j), and a blue pixel 702B(i,j). Similarly, the pixel 703(*i*+1,j) includes a red pixel, a green pixel, and a blue pixel.

Figure 8B:
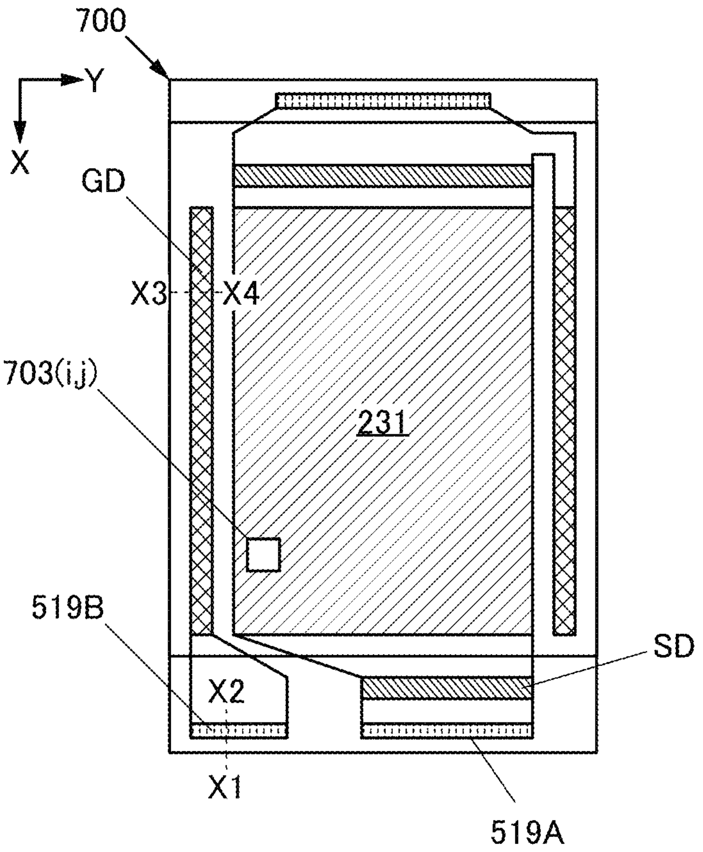

FIG. 8B illustrates an overall view of a display module 700. The display module 700 includes a display region 231. In the display region 231, a plurality of pixels 703 including the two pixels described above are formed in a matrix. A source driver region SD and a gate driver region GD are formed in the periphery of the display region 231. A signal supplied to the source driver region SD is input through a terminal portion 519A. A signal supplied to the source driver region GD is input through a terminal portion 519B.

Figure 9A:
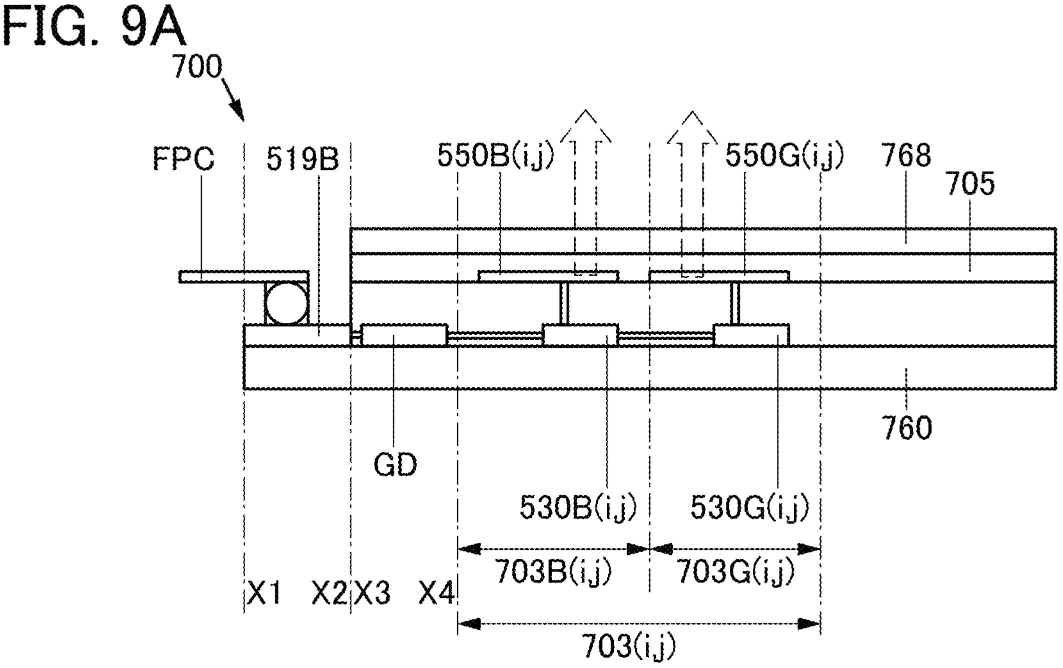
FIG. 9A and FIG. 9B are diagrams illustrating a structure of a display panel according to an embodiment.

FIG. 9A is a cross-sectional view illustrating a structure of the display module of one embodiment of the present invention. FIG. 9A is a view illustrating cross sections taken along the cutting line X1-X2 and the cutting line X3-X4 and of the pixel 703(*i,j*) in FIG. 8B.

A pixel circuit 530G(i,j) and a pixel circuit 530B(i,j) are formed over the first substrate 760. The pixel circuits are described later. A light-emitting element 550G(i,j) and a light-emitting element 550B(i,j) electrically connected to the pixel circuit 530G(i,j) and the pixel circuit 530B(i,j), respectively, are formed. A green pixel 703G(i,j) includes the pixel circuit 530G(i,j) and the light-emitting element 550G(i,j) electrically connected to the pixel circuit 530G(i,j). A blue pixel 703B(i,j) includes the pixel circuit 530B(i,j) and the light-emitting element 550B(i,j) electrically connected to the pixel circuit 530B(i,j).

An adhesive layer 705 placed above the light-emitting elements is used to perform sealing with a second substrate 768. An FPC is electrically connected to the terminal portion 519A and the terminal portion 519B.

<<Structure Example of Transistor>>

Figure 9B:
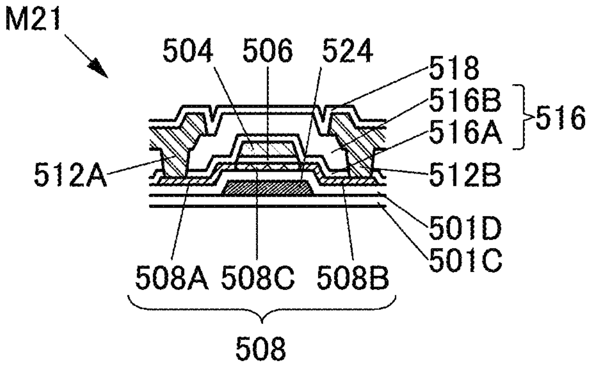

FIG. 9B illustrates the semiconductor element that can be used for the pixel circuit in the display panel of one embodiment of the present invention. As the semiconductor element, a transistor M21 can be used.

The transistor M21 is formed over an insulating film 501C, for example.

<<Structure Example 1 of Semiconductor Film 508>>

The transistor M21 includes a semiconductor film 508. A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel with higher resolution than a functional panel using hydrogenated amorphous silicon for the semiconductor film 508, for example, can be provided. A functional panel having less display unevenness than a functional panel using polysilicon for the semiconductor film 508, for example, can be provided. Smart glasses or a head-mounted display can be provided, for example.

<<Structure Example 2 of Semiconductor Film 508>>

For example, a metal oxide can be used for the semiconductor film 508. Specifically, an oxide semiconductor containing indium, an oxide semiconductor containing indium, gallium, and zinc, or an oxide semiconductor containing indium, gallium, zinc, and tin can be used as the metal oxide.

A transistor that uses a metal oxide for the semiconductor film 508 has lower leakage current in the off state than a transistor that uses amorphous silicon for a semiconductor film. Thus, a transistor that uses a metal oxide for the semiconductor film 508 is preferably used as a switch or the like. In that case, a potential of a floating node can be held for a longer time than in a circuit in which a transistor using amorphous silicon for a semiconductor film is used as a switch. The pixel circuit including the transistor that uses a metal oxide for the semiconductor film 508 can hold an image signal for a longer time than a pixel circuit including a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

The transistor M21 includes a conductive layer 504, a conductive layer 512A, and a conductive layer 512B.

The conductive layer 504 includes a region overlapping with a region 508C, and the conductive layer 504 has a function of a gate. The region 508C corresponds to a channel formation region.

The conductive layer 512A has one of a function of a source electrode and a function of a drain electrode, and the conductive layer 512B has the other of the function of the source electrode and the function of the drain electrode.

The semiconductor film 508 includes a region 508A and a region 508B, which are sometimes referred to as impurity regions or a source region and a drain region. The region 508A is electrically connected to the conductive layer 512A, and the region 508B is electrically connected to the conductive layer 512B.

An insulating film 506 includes a region positioned between the semiconductor film 508 and the conductive layer 504. The insulating film 506 has a function of a gate insulating film.

An insulating layer 516 is provided to cover the conductive layer 504. The insulating layer 516 has a structure in which a first insulating layer 516A and a second insulating layer 516B are stacked.

A conductive layer 524 can be used as a back gate of the transistor, and the conductive layer 524 can be provided below the semiconductor film. A structure in which a gate is placed above and below the semiconductor film is referred to as a dual gate structure in some cases. The semiconductor film 508 is positioned between a region of the conductive layer 524 and the conductive layer 504. The conductive layer 524 has a function of a gate electrode. An insulating film 501D is positioned between the semiconductor film 508 and the conductive layer 524 and has a function of a gate insulating film.

The insulating layer 518 is provided to cover the conductive layer 512A and the conductive layer 512B.

The semiconductor film used in the transistor of the pixel circuit can be formed at the same time as the semiconductor film used in the transistor of the driver circuit. In other words, the semiconductor film having the same composition as the semiconductor film used in the transistor of the pixel circuit can be used in the transistor of the driver circuit.

<Pixel Circuit>

Figure 10:
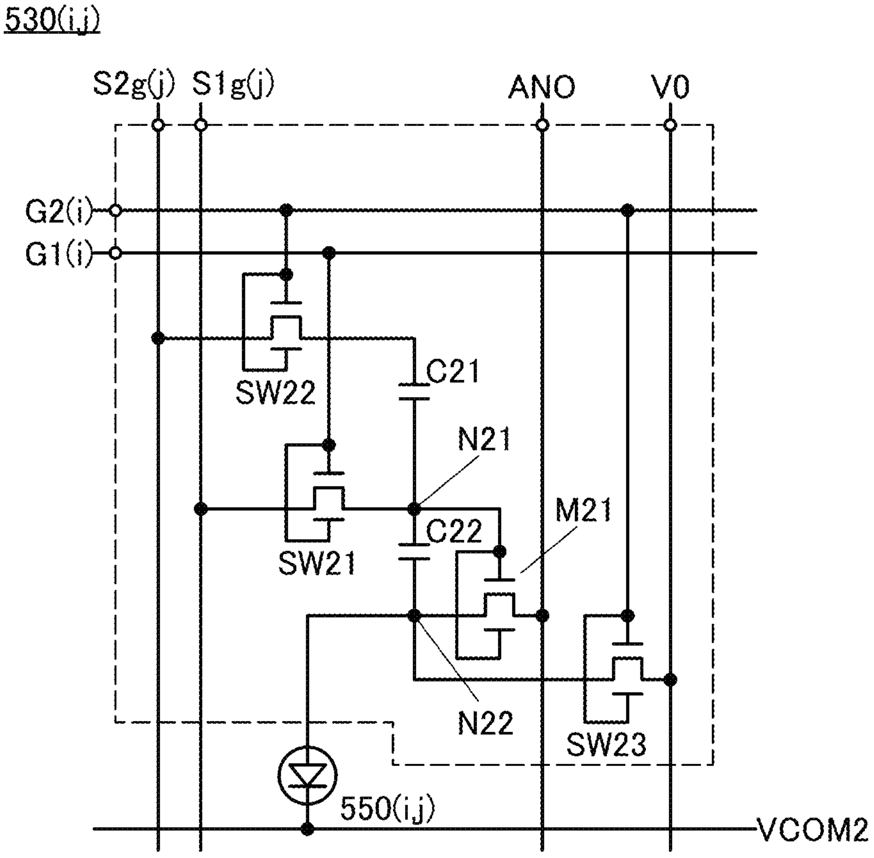
FIG. 10 is a diagram illustrating a pixel circuit according to an embodiment.

FIG. 10 illustrates a pixel circuit 530(*i,j*). The pixel circuit 530(*i,j*) includes three switching elements including a transistor and the like. The transistor M21 electrically connected to the light-emitting element 550G(i,j) is a driver transistor which is different from the switching element. For each transistor, a so-called dual gate structure which is the structure illustrated in FIG. 9B can be used. The pixel circuit 530(*i,j*) further includes a conductive layer G1(*i*), a conductive layer G2(*i*), a conductive layer S1*g*(*j*), a conductive layer S2*g*(*j*), a conductive layer V0, a conductive layer ANO, and a conductive layer VCOM2.

For example, the conductive layer G1(*i*) is supplied with a first selection signal, the conductive layer G2(*i*) is supplied with a second selection signal, the conductive layer S1*g*(*j*) is supplied with an image signal, and the conductive layer S2*g*(*j*) is supplied with a control signal.

The pixel circuit 530(*i,j*) is supplied with the first selection signal and obtains an image signal on the basis of the first selection signal. For example, the first selection signal can be supplied using the conductive layer G1(*i*). The image signal can be supplied using the conductive layer S1*g*(*j*). Note that the operation of supplying the first selection signal and making the pixel circuit 530(*i,j*) obtain an image signal can be referred to as "writing".

The pixel circuit 530(*i,j*) includes a capacitor C21 and a node N21. The pixel circuit 530(*i,j*) includes a node N22, a capacitor C22, and a switch SW23.

The transistor M21 includes a gate electrically connected to the node N21, the first electrode electrically connected to the light-emitting element 550(*i,j*), and the second electrode electrically connected to the conductive layer ANO.

The switch SW21 includes a first terminal electrically connected to the node N21 and a second terminal electrically connected to the conductive layer S1*g*(*j*), and has a function of controlling its on/off state on the basis of the potential of the conductive layer G1(*i*).

The switch SW22 includes a first terminal electrically connected to the conductive layer S2*g*(*j*), and has a function of controlling its on/off state on the basis of the potential of the conductive layer G2(*i*).

The capacitor C21 includes a conductive layer electrically connected to the node N21 and a conductive layer electrically connected to a second terminal of the switch SW22.

Accordingly, an image signal can be stored in the node N21. Alternatively, the potential of the node N21 can be changed using the switch SW22. Alternatively, the intensity of light emitted from the light-emitting element 550(*i,j*) can be controlled with the potential of the node N21.

The description in this embodiment can be used in combination with the other embodiments.

Embodiment 5

In this embodiment, structures of a data processing device of one embodiment of the present invention will be described with reference to the drawings.

Figure 11A:
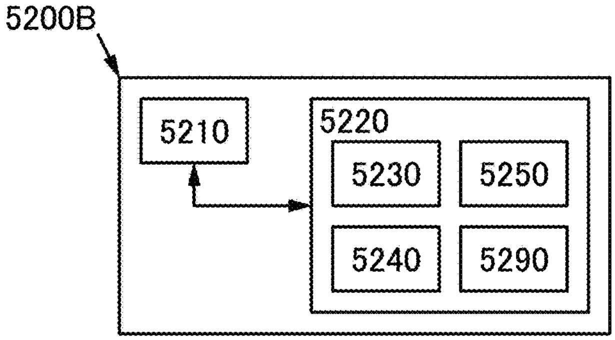
FIG. 11A to FIG. 11E are diagrams illustrating structures of a data processing device according to an embodiment.
Figure 11B:
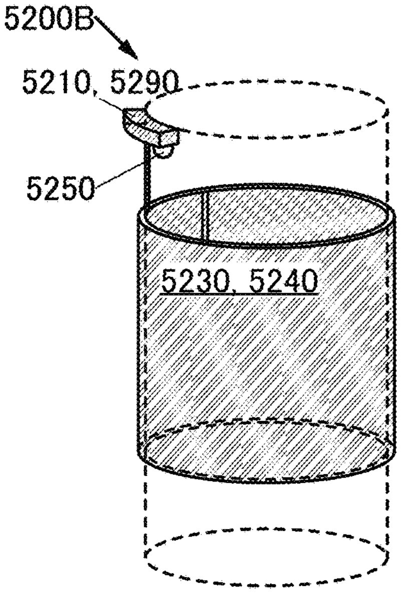
Figure 11C:
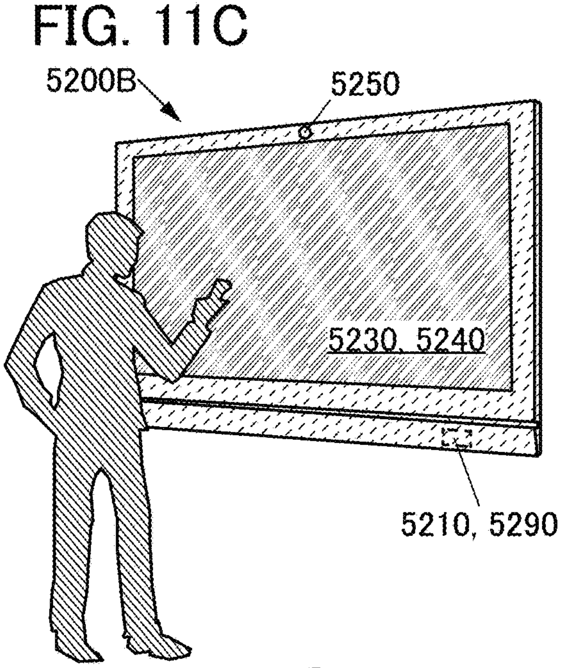
Figure 11D:
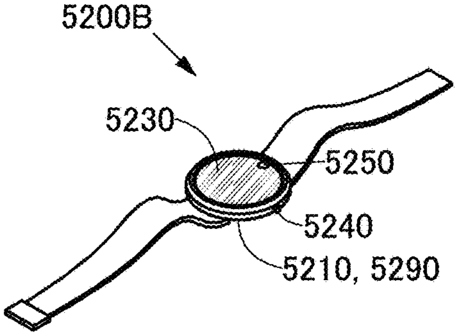
Figure 11E:
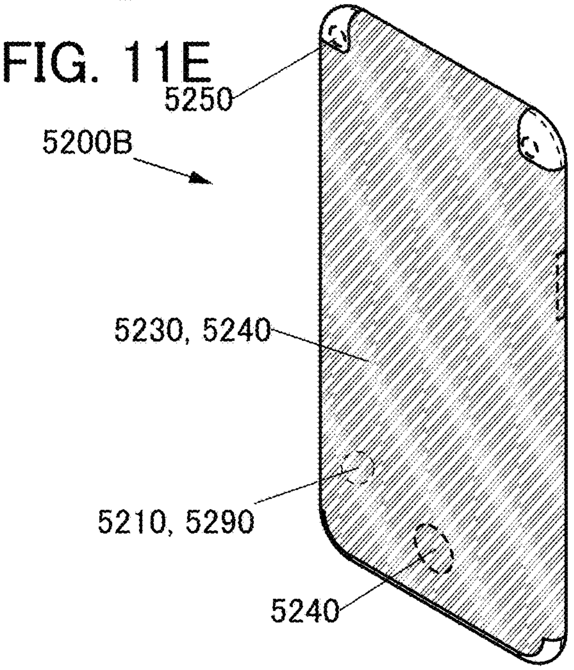
Figure 12A:
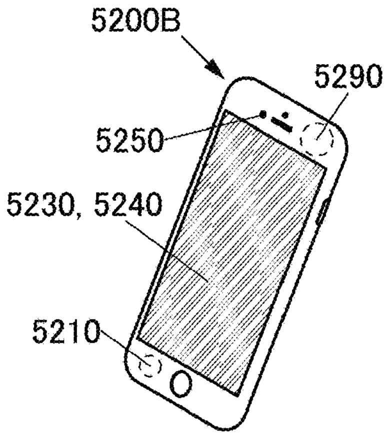
FIG. 12A to FIG. 12E are diagrams illustrating structures of a data processing device according to an embodiment.
Figure 12B:
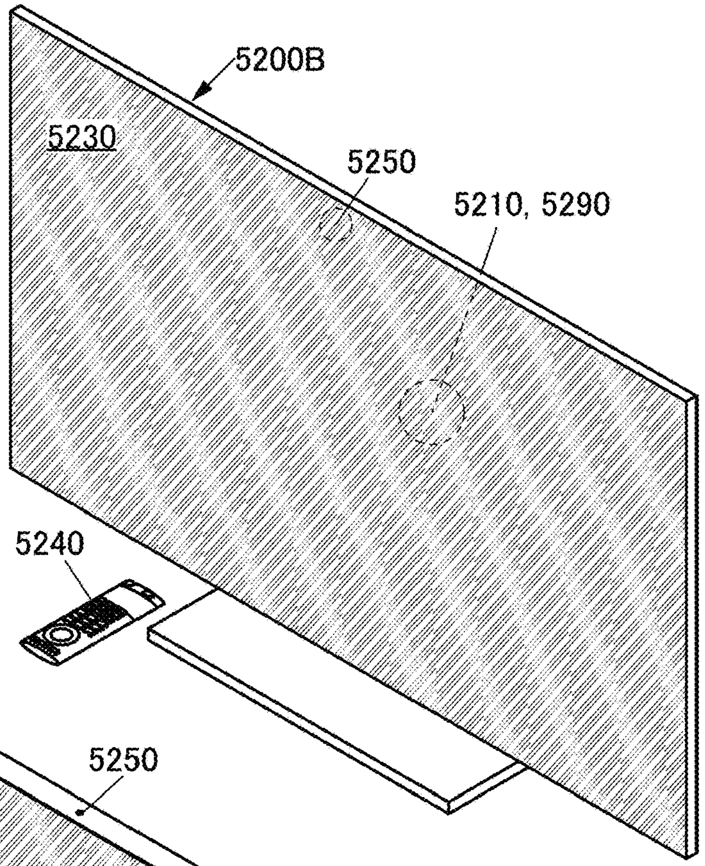
Figure 12C:
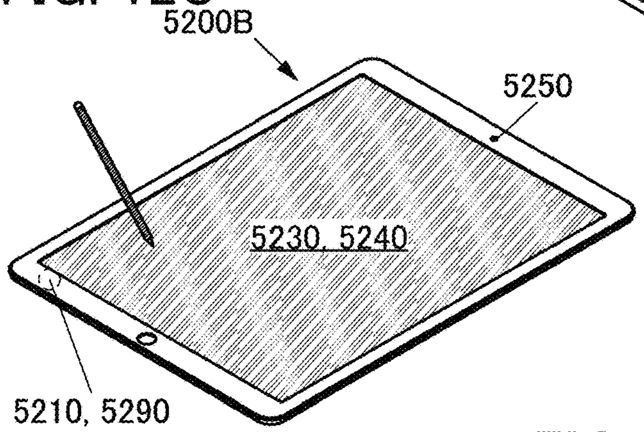
Figure 12D:
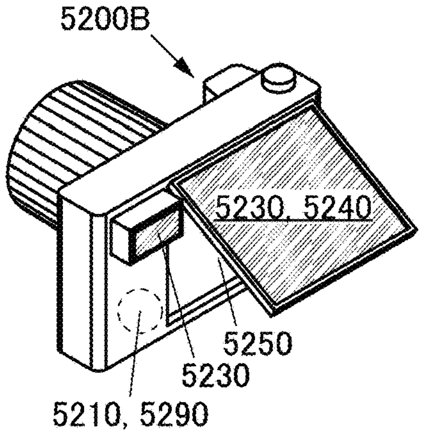
Figure 12E:
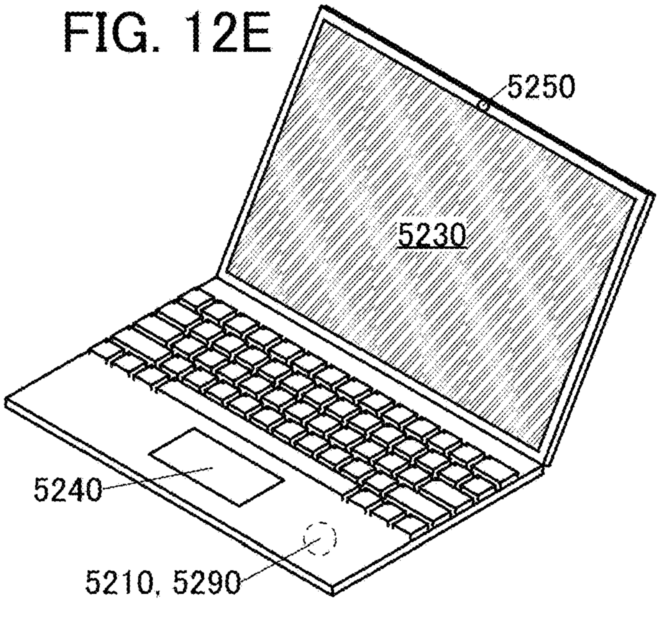
Figure 13A:
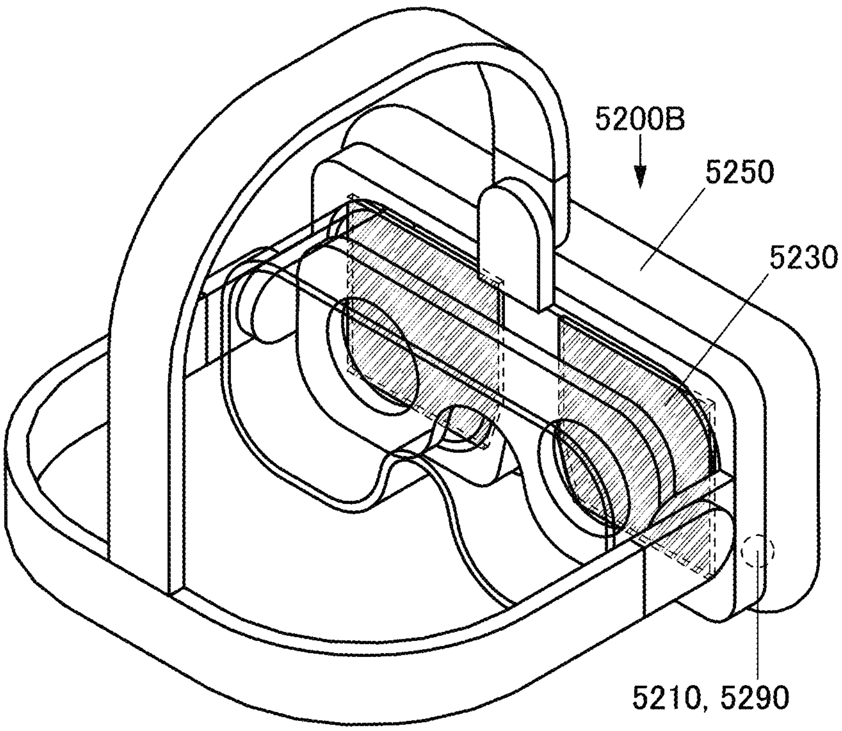
FIG. 13A and FIG. 13B are diagrams illustrating a structure of a data processing device according to an embodiment.
Figure 13B:
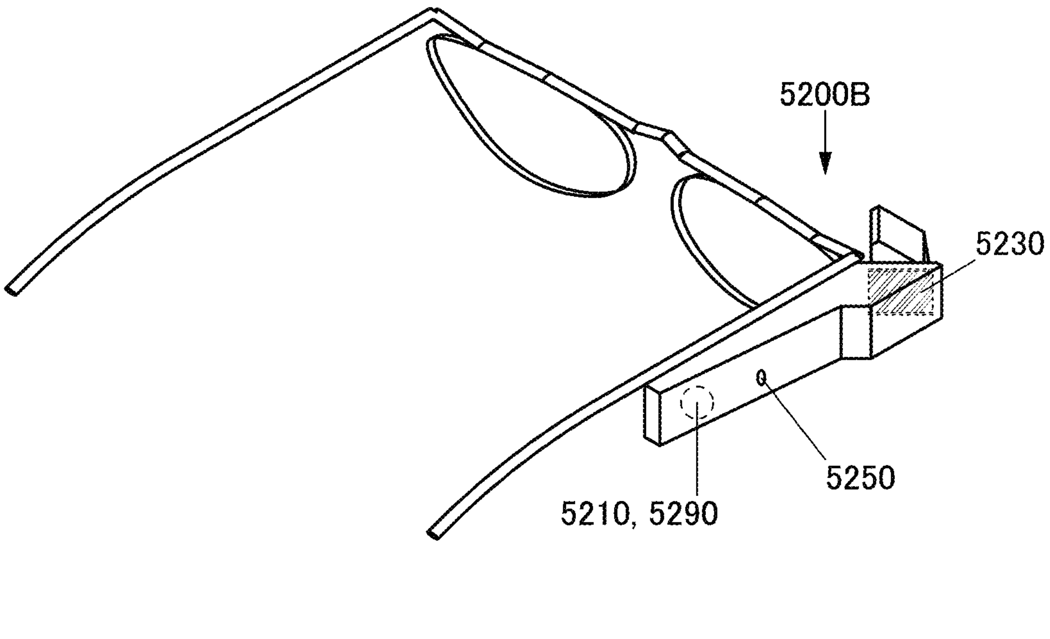

FIG. 11A to FIG. 13B are diagrams illustrating structures of the data processing device of one embodiment of the present invention. FIG. 11A is a block diagram of the data processing device, and FIG. 11B to FIG. 11E are perspective views illustrating structures of the data processing device. FIG. 12A to FIG. 12E are perspective views illustrating structures of the data processing device. FIG. 13A and FIG. 13B are perspective views illustrating structures of the data processing device.

<Data Processing Device>

A data processing device 5200B described in this embodiment includes an arithmetic device 5210 and an input/output device 5220 (see FIG. 11A).

The arithmetic device 5210 has a function of being supplied with operation information and a function of supplying image information on the basis of the operation information.

The input/output device 5220 includes a display portion 5230, an input portion 5240, a sensing portion 5250, and a communication portion 5290 and has a function of supplying operation information and a function of being supplied with image information. The input/output device 5220 also has a function of supplying sensing information, a function of supplying communication information, and a function of being supplied with communication information.

The input portion 5240 has a function of supplying operation information. For example, the input portion 5240 supplies operation information on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image information. For example, the display panel described in Embodiment 1 can be used for the display portion 5230.

The sensing portion 5250 has a function of supplying sensing information. For example, the sensing portion 5250 has a function of sensing a surrounding environment where the data processing device is used and supplying sensing information.

Specifically, an illuminance sensor, an imaging device, an attitude detection device, a pressure sensor, a human motion sensor, or the like can be used as the sensing portion 5250.

The communication portion 5290 has a function of being supplied with communication information and a function of supplying communication information. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 11B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image information on the basis of the path of a pointer used by a user (see FIG. 11C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

<<Structure Example 3 of Data Processing Device>>

The data processing device can receive information from another device, and the information can be displayed on the display portion 5230 (see FIG. 11D). Several options can be displayed. The user can choose some from the options and send a reply to a transmitter of the information. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Data Processing Device>>

For example, the display portion 5230 has a surface gently curved along a side surface of a housing (see FIG. 11E). The display portion 5230 includes a display panel, and the display panel has a function of performing display on the front surface, the side surfaces, the top surface, and the rear surface, for example. Thus, for example, a mobile phone can display information not only on its front surface but also on its side surfaces, its top surface, and its rear surface.

<<Structure Example 5 of Data Processing Device>>

For example, the data processing device can receive information via the Internet and display the information on the display portion 5230 (see FIG. 12A). A created message can be checked on the display portion 5230. The created message can be sent to another device. The data processing device has a function of changing its display method in accordance with the illuminance of a usage environment, for example. Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

A remote controller can be used as the input portion 5240 (see FIG. 12B). For example, the data processing device can receive information from a broadcast station or via the Internet and display the information on the display portion 5230. An image of a user can be captured using the sensing portion 5250. The image of the user can be transmitted. The data processing device can acquire a viewing history of the user and provide it to a cloud service. The data processing device can acquire recommendation information from a cloud service and display the information on the display portion 5230. A program or a moving image can be displayed on the basis of the recommendation information. For example, the data processing device has a function of changing its display method in accordance with the illuminance of a usage environment. Accordingly, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 12C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 12D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 12E). As another example, part of image data can be displayed on the display portion 5230 and another part of the image data can be displayed on a display portion of another data processing device. Image signals can be supplied. With the communication portion 5290, information to be written can be obtained from an input portion of another data processing device. Thus, a large display region can be utilized by using a portable personal computer, for example.

<<Structure Example 10 of Data Processing Device>>

The data processing device includes, for example, the sensing portion 5250 that senses an acceleration or a direction (see FIG. 13A). The sensing portion 5250 can supply information on the position of the user or the direction in which the user faces. The data processing device can generate image information for the right eye and image information for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensing portion 5250 that senses an acceleration or a direction (see FIG. 13B). The sensing portion 5250 can supply information on the position of the user or the direction in which the user faces. The data processing device can generate image information in accordance with the position of the user or the direction in which the user faces. Accordingly, the information can be shown together with areal-world scene, for example. An augmented reality image can be displayed on a glasses-type data processing device.

Note that this embodiment can be combined with any of the other embodiments described in this specification as appropriate.

REFERENCE NUMERALS

760: first substrate, 762: first electrode, 763: insulator, 764: opening portion, 770: nozzle, 771: droplet, 772: material layer, 773*a*: material layer, 773*b*: material layer, 773: material layer, 779*a*: mask layer, 779*b*: mask layer, 780: nozzle, 781: droplet, 782: material layer, 783*a*: material layer, 783*b*: material layer, 783: material layer, 789*a*: mask layer, 789*b*: mask layer, 790: nozzle, 791: droplet, 792: material layer, 793*a*: material layer, 793*b*: material layer, 793: material layer, 799*a*: mask layer, 799*b*: mask layer

The invention claimed is:

1. A manufacturing method of a display panel comprising:

forming an insulator comprising a first opening portion and a second opening portion over a substrate;

forming a first material layer in the first opening portion and on a first part of an upper surface of the insulator and a second material layer in the second opening portion and on a second part of the upper surface of the insulator by a wet process;

forming a first resist mask over the first material layer and a second resist mask over the second material layer after forming the second material layer;

forming a third material layer in the first opening portion by partly removing the first material layer from the first part of the upper surface of the insulator with the first resist mask;

forming a fourth material layer in the second opening portion by partly removing the second material layer from the second part of the upper surface of the insulator with the second resist mask; and removing the first resist mask and the second resist mask after forming the third material layer and the fourth material layer, wherein the third material layer is included in a first light-emitting element, and wherein the fourth material layer is included in a second light-emitting element.

2. The manufacturing method of a display panel according to claim 1, wherein the wet process is an inkjet method.

3. The manufacturing method of a display panel according to claim 1, further comprising:

removing the first resist mask and the second resist mask to expose the third material layer and the fourth material layer.

4. The manufacturing method of a display panel according to claim 1, wherein the third material layer comprises a light-emitting layer of the first light-emitting element, and wherein the fourth material layer comprises a light-emitting layer of the second light-emitting element.

5. The manufacturing method of a display panel according to claim 1, wherein the third material layer comprises a hole-transport layer of the first light-emitting element, and wherein the fourth material layer comprises a hole-transport layer of the second light-emitting element.

6. The manufacturing method of a display panel according to claim 1, wherein a width of the first resist mask is less than or equal to a width of the first opening portion, and wherein a width of the second resist mask is less than or equal to a width of the second opening portion.

7. A manufacturing method of a display panel comprising:

forming an insulator comprising a first opening portion and a second opening portion over a substrate;

forming a first layer including a hole-transport material in the first opening portion and the second opening portion by a wet process;

forming a second layer including a first light-emitting material over the first layer in the first opening portion and a third layer including a second light-emitting material over the first layer in the second opening portion by the wet process;

forming a first resist mask over the second layer and a second resist mask over the third layer after forming the third layer;

forming a first hole-transport region and a first light-emitting layer in the first opening portion by partly removing the first layer and the second layer with the first resist mask;

forming a second hole-transport region and a second light-emitting layer in the second opening portion by partly removing the first layer and the third layer with the second resist mask; and removing the first resist mask and the second resist mask after forming the first hole-transport region, the first light-emitting layer, the second hole-transport region, and the second light-emitting layer, wherein the first hole-transport region and the first light-emitting layer are included in a first light-emitting element, and wherein the second hole-transport region and the second light-emitting layer is included in a second light-emitting element.

8. The manufacturing method of a display panel according to claim 7, wherein the wet process is an inkjet method.

9. The manufacturing method of a display panel according to claim 7, wherein a width of the first resist mask is less than or equal to a width of the first opening portion, and wherein a width of the second resist mask is less than or equal to a width of the second opening portion.

10. The manufacturing method of a display panel according to claim 1, wherein the first material layer and the second material layer are formed at the same time.

11. The manufacturing method of a display panel according to claim 1, wherein the first resist mask and the second resist mask are formed at the same time.

12. The manufacturing method of a display panel according to claim 1, wherein the third material layer and the fourth material layer are formed at the same time.

13. The manufacturing method of a display panel according to claim 7, wherein the second layer and the third layer are formed at the same time.

14. The manufacturing method of a display panel according to claim 7, wherein the first resist mask and the second resist mask are formed at the same time.

15. The manufacturing method of a display panel according to claim 7, wherein the first hole-transport region, the first light-emitting layer, the second hole-transport region, and the second light-emitting layer are formed at the same time.

* * * * *